(12) United States Patent
Chida

(10) Patent No.: US 9,685,627 B2
(45) Date of Patent: Jun. 20, 2017

(54) FUNCTION PANEL AND MANUFACTURING METHOD THEREOF

(71) Applicant: Semiconductor Energy Laboratory Co., Ltd., Kanagawa-ken (JP)

(72) Inventor: Akihiro Chida, Kanagawa (JP)

(73) Assignee: Semiconductor Energy Laboratory Co., Ltd. (JP)

(*) Notice: Subject to any disclaimer, the term of this patent is extended or adjusted under 35 U.S.C. 154(b) by 0 days.

(21) Appl. No.: 14/980,266

(22) Filed: Dec. 28, 2015

(65) Prior Publication Data

US 2016/0190512 A1   Jun. 30, 2016

(30) Foreign Application Priority Data

Dec. 29, 2014   (JP) ................................ 2014-266983

(51) Int. Cl.
H01L 51/52        (2006.01)
H01L 51/00        (2006.01)

(52) U.S. Cl.
CPC ........ H01L 51/5237 (2013.01); H01L 51/003 (2013.01); H01L 51/5246 (2013.01)

(58) Field of Classification Search
CPC .................................................. H01L 21/5253
See application file for complete search history.

(56) References Cited

U.S. PATENT DOCUMENTS

| 7,335,573 B2* | 2/2008 | Takayama ......... H01L 21/76251 257/E21.567 |
| 8,284,369 B2 | 10/2012 | Chida et al. |
| 2012/0217516 A1 | 8/2012 | Hatano et al. |
| 2015/0044792 A1* | 2/2015 | Aoyama ............... H01L 51/003 438/27 |

FOREIGN PATENT DOCUMENTS

JP   2012-190794   10/2012

OTHER PUBLICATIONS

Chida, A. et al., "3.4-Inch Flexible High-Resolution Full-Color Top-Emitting AMOLED Display," SID 2013 Digest, May 21, 2013, pp. 196-198.

* cited by examiner

*Primary Examiner* — Yu-Hsi D Sun
(74) *Attorney, Agent, or Firm* — Husch Blackwell LLP

(57) ABSTRACT

A novel functional panel is provided. The functional panel includes a first substrate, a second substrate, a first layer, a second layer, a sealing portion, and a first adhesive layer. The sealing portion is between the first layer and the second layer. The first adhesive layer is between the first layer and the first substrate. The second substrate is in contact with the second layer. When a surface of the first layer which faces the first substrate is referred to as a first surface and a surface of the second layer which is in contact with the second substrate is referred to as a second surface, the functional panel has a plurality of regions having different distances between the first surface and the second surface.

5 Claims, 13 Drawing Sheets

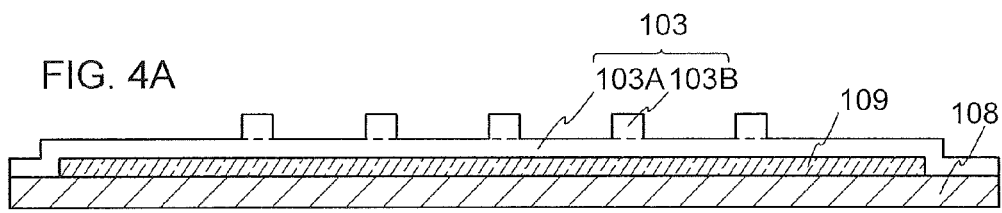
FIG. 4A
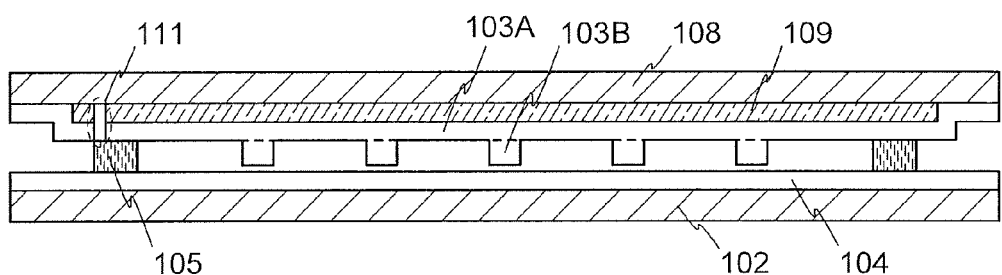
FIG. 4B
FIG. 4C
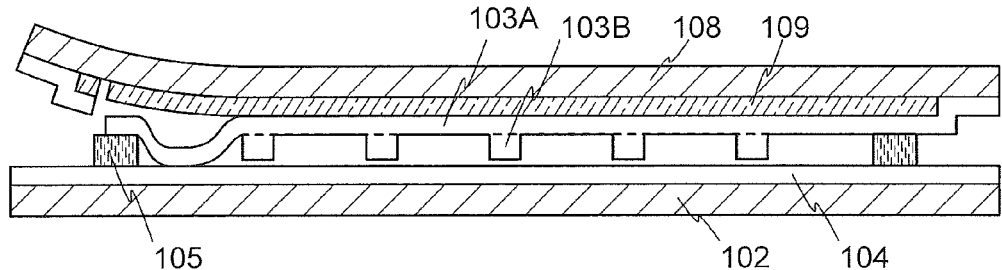
FIG. 4D
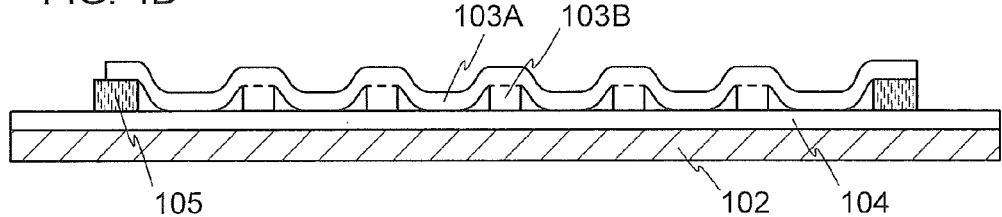
FIG. 4E
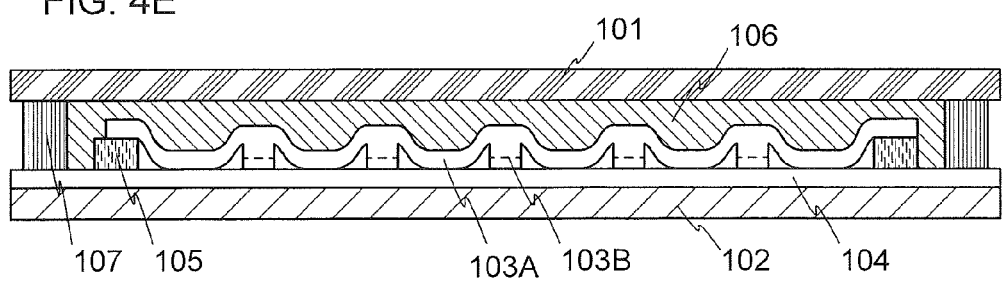

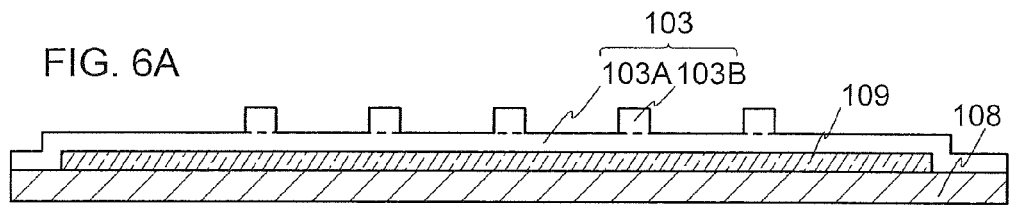
FIG. 6A
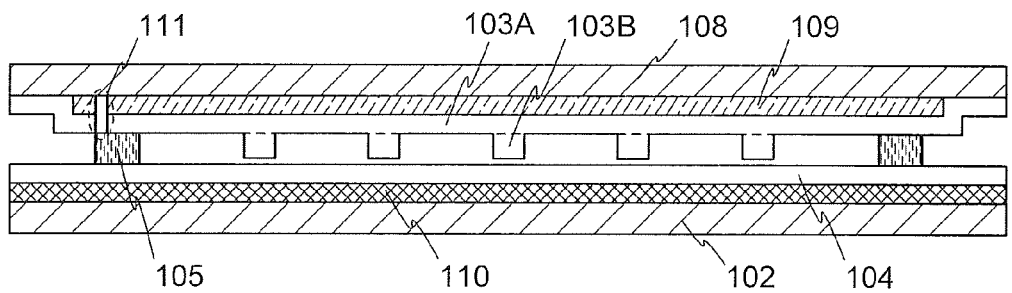
FIG. 6B
FIG. 6C
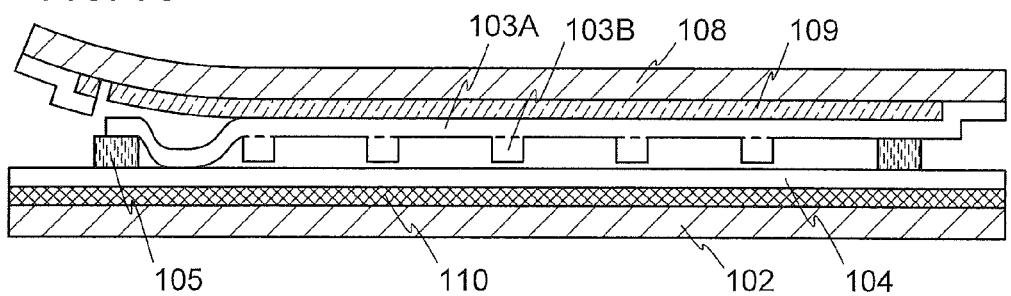
FIG. 6D
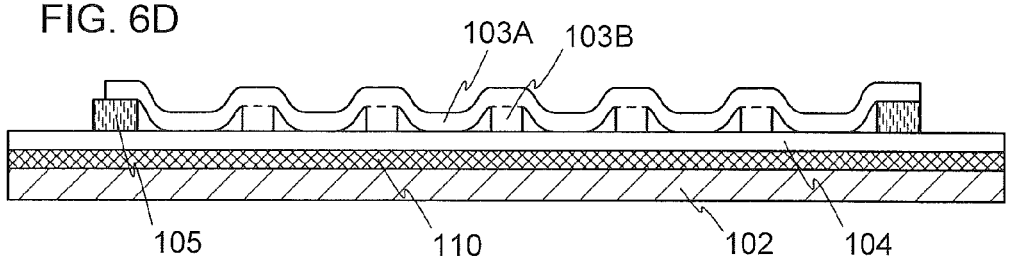
FIG. 6E
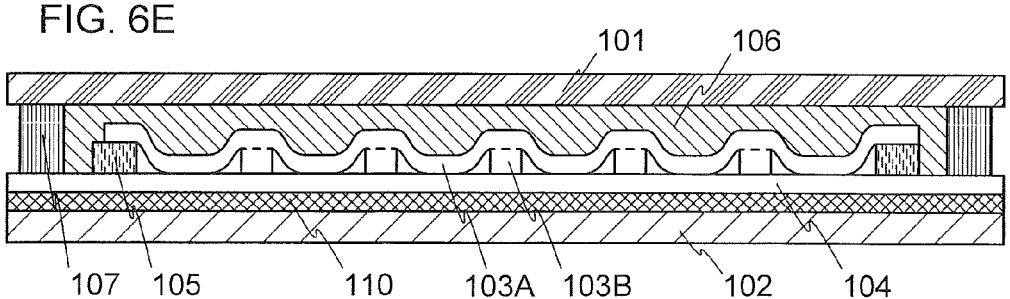

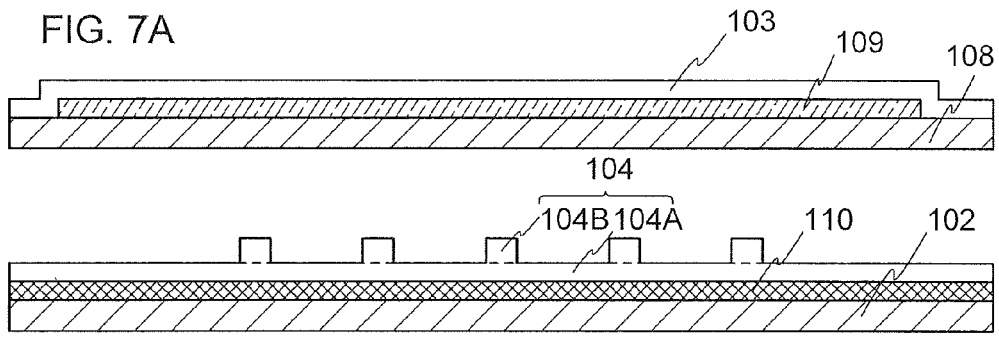
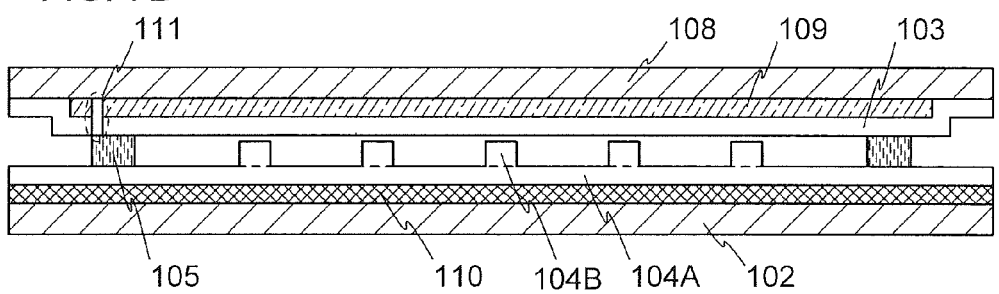
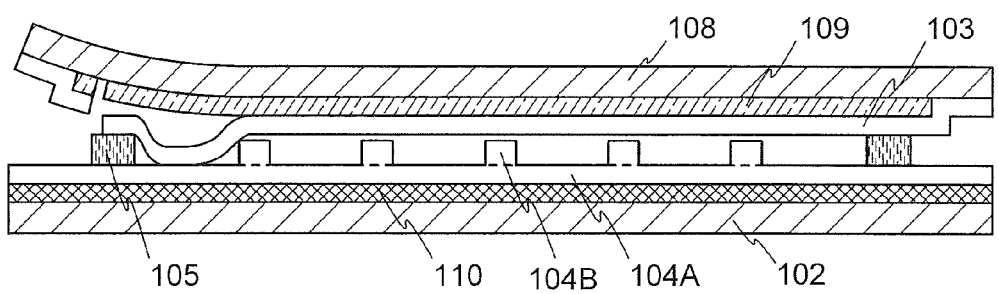
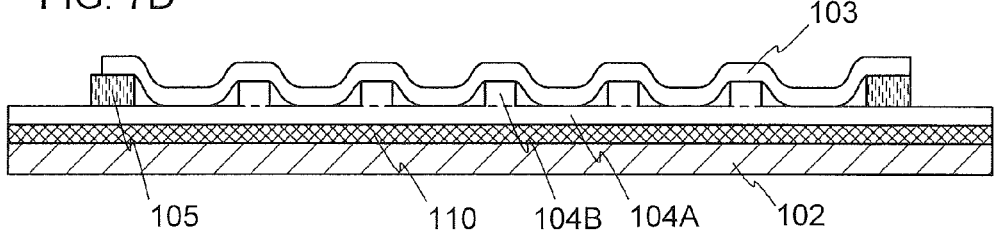
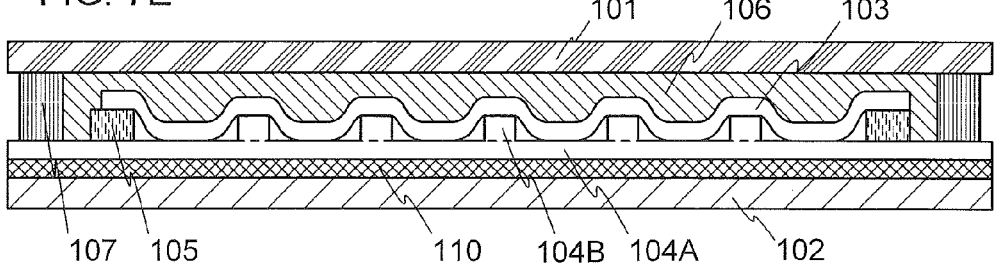

FUNCTION PANEL AND MANUFACTURING METHOD THEREOF

BACKGROUND OF THE INVENTION

1. Field of the Invention

One embodiment of the present invention relates to a functional panel, a device, or a data processor.

Note that one embodiment of the present invention is not limited to the above technical field. Examples of the technical field of one embodiment of the present invention include a semiconductor device, a display device, a light-emitting device, a power storage device, a memory device, a method for driving any of them, and a method for manufacturing any of them.

2. Description of the Related Art

In recent years, a flexible device in which a functional element such as a semiconductor element, a display element, or a light-emitting element is provided over a substrate having flexibility (hereinafter also referred to as a flexible substrate) has been developed. Typical examples of the flexible device include a lighting device, an image display device, a variety of semiconductor circuits including a semiconductor element such as a transistor, and the like.

As a method for manufacturing a device including a flexible substrate, a technique has been developed in which a functional element such as a thin film transistor and an organic electroluminescence element (an organic EL element) is formed over a formation substrate (e.g., a glass substrate or a quartz substrate), and then the functional element is transferred to a flexible substrate. This technique needs a process of peeling a layer including the functional element from the formation substrate (also referred to as a peeling process).

Since a layer including a functional element is thin, a peeling process is performed after a formation substrate is bonded to another supporting substrate. In Patent Document 1, peeling is performed with an adhesive layer provided between a formation substrate and a support substrate, for example. Accordingly, the adhesive layer is between a layer surface over which a functional element and the like are provided and a flexible substrate to which the layer is transferred.

REFERENCE

Patent Document

[Patent Document 1] Japanese Published Patent Application No. 2012-190794

SUMMARY OF THE INVENTION

An object of one embodiment of the present invention is to provide a novel functional panel that is highly convenient or reliable. Another object of one embodiment of the present invention is to provide a novel device that is highly convenient or reliable. Another object of one embodiment of the present invention is to provide a novel device such as a semiconductor device, a light-emitting device, a display device, an electronic device, or a lighting device.

One object of one embodiment of the present invention is to reduce the material cost in the manufacturing steps. Another object of one embodiment of the present invention is to save the resource in the manufacturing steps. Another object of one embodiment of the present invention is to reduce the number of manufacturing steps.

Note that the descriptions of these objects do not disturb the existence of any other object. In one embodiment of the present invention, not all of these objects need to be achieved. Other objects can be derived from the description of the specification, the drawings, and the claims.

One embodiment of the present invention is a functional panel which includes a first substrate, a second substrate, a first layer, a second layer, a sealing portion, and a first adhesive layer. The sealing portion is between the first layer and the second layer. The first adhesive layer is between the first layer and the first substrate. The second substrate includes a region in contact with the second layer. When a surface of the first layer which faces the first substrate is referred to as a first surface and a surface of the second layer which is in contact with the second substrate is referred to as a second surface, the functional panel includes a plurality of regions having different distances between the first surface and the second surface.

One embodiment of the present invention is a functional panel which includes a first substrate, a second substrate, a first layer, a second layer, a third layer, a sealing portion, and a first adhesive layer. The sealing portion is between the first layer and the second layer. The first adhesive layer is between the first layer and the first substrate. The third layer is between the second layer and the second substrate. When a surface of the first layer which faces the first substrate is referred to as a first surface and a surface of the second layer which faces the second substrate is referred to as a second surface, the functional panel includes a plurality of regions having different distances between the first surface and the second surface.

One embodiment of the present invention is a functional panel which includes a first substrate, a second substrate, a first layer, a second layer, a sealing portion, a first adhesive layer, and a second adhesive layer. The sealing portion is between the first layer and the second layer. The first adhesive layer is between the first layer and the first substrate. The second adhesive layer is between the second layer and the second substrate. When a surface of the first layer which faces the first substrate is referred to as a first surface and a surface of the second layer which faces the second substrate is referred to as a second surface, the functional panel includes a plurality of regions having different distances between the first surface and the second surface.

One embodiment of the present invention is a functional panel with any of the above structures in which at least one of the first layer and the second layer includes a projecting portion and the distance between the first surface and the second surface in a region including the projecting portion is longer than that in the other region.

One embodiment of the present invention is a functional panel with any of the above structures in which the first layer includes a region in contact with the second layer.

One embodiment of the present invention is a functional panel with any of the above structures in which at least one of the first layer and the second layer includes a functional element. One embodiment of the present invention is a functional panel in which the functional element is a transistor, an organic electroluminescent element, or a micro electro mechanical systems (MEMS).

One embodiment of the present invention is a functional panel with any of the above structures in which the pressure in a space surrounded by the first layer and the second layer or surrounded by the first layer, the second layer, and the sealing portion is lower than an atmospheric pressure. One embodiment of the present invention is a functional panel in which the pressure in the space is lower than or equal to 10 Pa.

One embodiment of the present invention is a method for manufacturing a functional panel, including a first step of preparing a first formation substrate provided with a first layer with a first peeling layer positioned therebetween, and a second substrate including a region in contact with the second layer, a second step of bonding the first layer and the second layer to each other with a sealing portion in a reduced-pressure atmosphere, a third step of peeling the first peeling layer and the first layer in an atmosphere with a pressure higher than that of the reduced-pressure atmosphere, and a fourth step of bonding the first layer and the first substrate to each other with a first adhesive layer.

One embodiment of the present invention is a method for manufacturing a functional panel, including a first step of preparing a first formation substrate provided with a first layer with a first peeling layer positioned therebetween, and a second substrate provided with the second layer with a third layer positioned therebetween, a second step of bonding the first layer and the second layer to each other with a sealing portion in a reduced-pressure atmosphere, a third step of peeling the first peeling layer and the first layer in an atmosphere with a pressure higher than that of the reduced-pressure atmosphere, and a fourth step of bonding the first layer and the first substrate to each other with a first adhesive layer.

One embodiment of the present invention is a method for manufacturing a functional panel, including a first step of preparing a first formation substrate provided with a first layer with a first peeling layer positioned therebetween, and a second formation substrate provided with a second layer with a second peeling layer positioned therebetween, a second step of bonding the first layer and the second layer to each other with a sealing portion in a reduced-pressure atmosphere, a third step of peeling the first peeling layer and the first layer in an atmosphere with a pressure higher than that of the reduced-pressure atmosphere, a fourth step of bonding the first layer and the first substrate to each other with a first adhesive layer, a fifth step of peeling the second peeling layer and the second layer in an atmosphere with a pressure higher than that of the reduced-pressure atmosphere, and a sixth step of bonding the second layer and the second substrate to each other with a second adhesive layer.

One embodiment of the present invention is any of the above methods for manufacturing a functional panel in which the first layer and the second layer are bonded to each other in the reduced-pressure atmosphere with a pressure lower than or equal to 10 Pa.

One embodiment of the present invention is any of the above methods for manufacturing a functional panel in which an atmospheric pressure is higher than that of the reduced-pressure atmosphere.

One embodiment of the present invention is a semiconductor device, a light-emitting device, a display device, an electronic device, or a lighting device using the functional panel with any of the above structures.

Another embodiment of the present invention is a method for manufacturing a semiconductor device, a light-emitting device, a display device, an electronic device, or a lighting device using any of the above manufacturing methods.

Note that the light-emitting device in this specification includes, in its category, a display device using a light-emitting element. Furthermore, the light-emitting device may be included in a module in which a light-emitting element is provided with a connector such as an anisotropic conductive film or a TCP (tape carrier package); a module having a TCP at the tip of which a printed wiring board is provided; and a module in which an IC (integrated circuit) is directly mounted on a light-emitting element by a COG (chip on glass) method. The light-emitting device may also be included in lighting equipment or the like.

One embodiment of the present invention can provide a novel functional panel that is highly convenient or reliable. Another embodiment of the present invention can provide a novel device that is highly convenient or reliable. Another embodiment of the present invention can provide a device such as a novel semiconductor device, a novel light-emitting device, a novel display device, a novel electronic device, or a novel lighting device.

One embodiment of the present invention can reduce the material cost in the manufacturing steps. Another embodiment of the present invention can save the resource in the manufacturing steps. Another embodiment of the present invention can reduce the number of manufacturing steps.

Note that the descriptions of these effects do not disturb the existence of any other effects. In one embodiment of the present invention, not all of these effects need to be achieved. Other effects can be derived from the description of the specification, the drawings, and the claims.

BRIEF DESCRIPTION OF THE DRAWINGS

In the accompanying drawings:

FIGS. 4A to 4E illustrate a method for manufacturing a functional panel of an embodiment;

FIGS. 6A to 6E illustrate a method for manufacturing a functional panel of an embodiment;

FIGS. 7A to 7E illustrate a method for manufacturing a functional panel of an embodiment;

DETAILED DESCRIPTION OF THE INVENTION

Figure 1A:
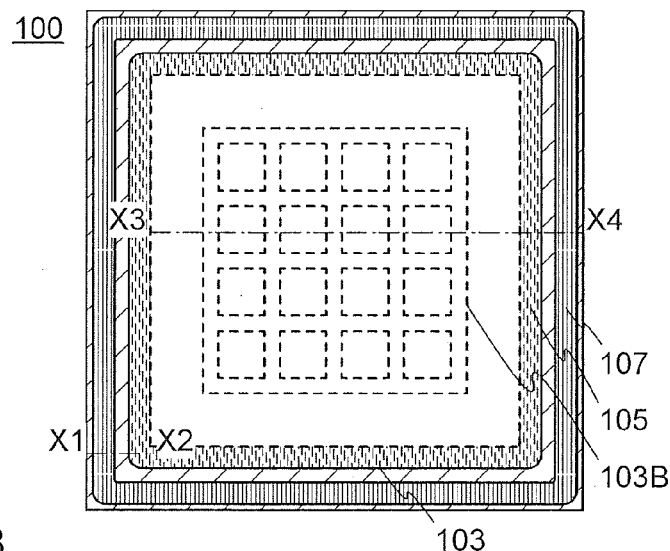
FIGS. 1A to 1C illustrate functional panels of an embodiment.

Embodiments will be described in detail with reference to the accompanying drawings. Note that the present invention is not limited to the description below, and it is easily understood by those skilled in the art that various changes and modifications can be made without departing from the spirit and scope of the present invention. Therefore, the present invention should not be construed as being limited to the description in the following embodiments.

Note that in the structures of the invention described below, the same portions or portions having similar functions are denoted by the same reference numerals in different drawings, and description of such portions is not repeated. Furthermore, the same hatching pattern is applied to portions having similar functions, and the portions are not especially denoted by reference numerals in some cases.

The position, size, range, or the like of each structure illustrated in drawings is not accurately represented in some cases for easy understanding. Therefore, the disclosed invention is not necessarily limited to the position, size, range, or the like disclosed in the drawings.

After formed over a formation substrate, a layer to be peeled can be peeled off from the formation substrate and then transferred to another substrate. This method makes it possible that, for example, a layer to be peeled which is formed over a high heat-resistant formation substrate can be transferred to a low heat-resistant substrate, and the manufacturing temperature of the layer to be peeled is not limited by the low heat-resistant substrate. The layer to be peeled is transferred to a substrate or the like which is more lightweight, thinner, or more flexible than the formation substrate, whereby a variety of devices such as a semiconductor device, a light-emitting device, or a display device can be made more lightweight, thinner, and more flexible. Note that the layer to be peeled is also referred to as a first layer or a second layer in this specification.

A device that can be manufactured according to one embodiment of the present invention includes a functional element. Examples of the functional element include a semiconductor element such as a transistor; a light-emitting diode; a light-emitting element such as an inorganic EL element and an organic EL element; and a display element such as a liquid crystal element. For example, a semiconductor device including a transistor and a light-emitting device including a light-emitting element (here, a display device including a transistor and a light-emitting element is also included) are examples of the device that can be manufactured according to the present invention.

For example, to protect an organic EL element that is likely to deteriorate due to moisture or the like, a protective film having low water permeability can be formed over a glass substrate at a high temperature and transferred to an organic resin substrate having flexibility. Even when heat resistance or a waterproof property of the organic resin substrate is low, a highly reliable flexible light-emitting device can be manufactured by forming an organic EL element over the protective film transferred to the organic resin substrate.

Embodiment 1

<Structure Example 1-1 of Functional Panel>

Figure 1B:
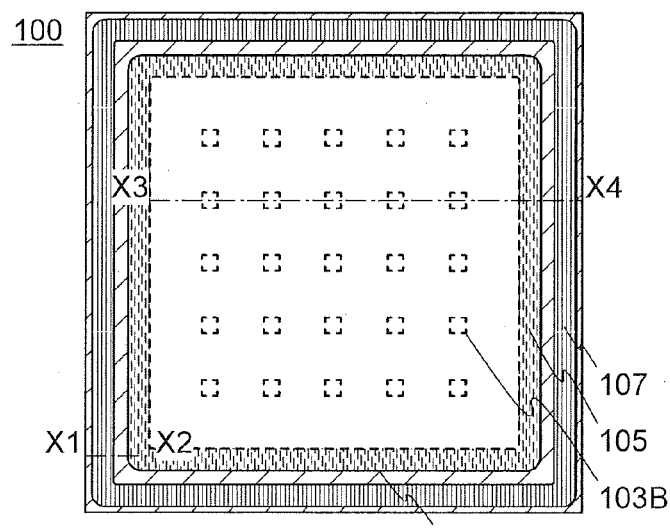
Figure 1C:
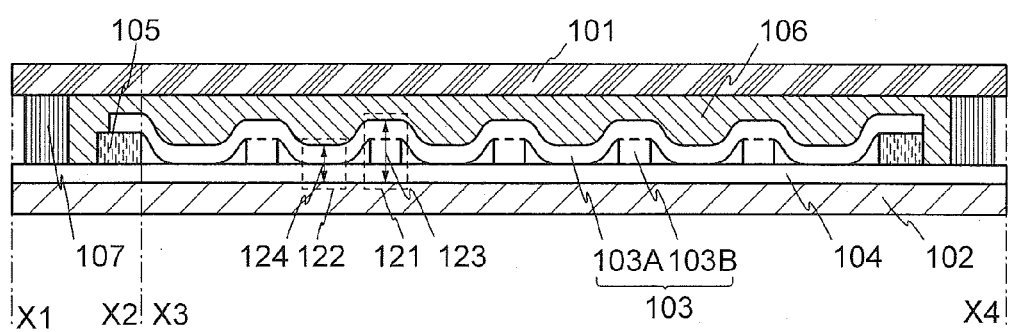

FIGS. 1A to 1C illustrate structures of a functional panel of one embodiment of the present invention. FIGS. 1A and 1B each are a top view of a functional panel 100 of one embodiment of the present invention, and FIG. 1C is a cross-sectional view taken along lines X1-X2 and X3-X4 in FIG. 1A. In FIGS. 1A and 1B, some components are omitted.

The functional panel 100 includes a first substrate 101, a second substrate 102, a first layer 103, a second layer 104, a sealing portion 105, a first adhesive layer 106, and a first partition 107. The first layer 103 includes a thin film portion 103A and a projecting portion 103B. Note that the dotted lines in the first layer 103 in the drawing represent boundaries between the thin film portion 103A and the projecting portion 103B.

The projecting portion 103B can have a variety of geometrical shapes. For example, the number of projecting portions 103B can be one or more. Side surfaces of the projecting portion 103B may be tapered, reversely tapered, or perpendicular with respect to the surfaces around the projecting portion. The projecting portion 103B can have a lattice structure when seen from above (see FIG. 1A). The projecting portion 103B can have island structures (see FIG. 1B). The islands may have any shape when seen from above; a circle shape or a polygonal shape.

The first layer 103 and the second layer 104 are bonded to each other with the sealing portion 105 provided therebetween. For example, the sealing portion 105 is provided surrounding at least one of the projecting portions 103B.

The second substrate 102 includes a region in contact with the second layer 104. The first adhesive layer 106 is between the first layer 103 and the first substrate 101. The first partition 107 is provided surrounding the first adhesive layer 106.

When a surface of the first layer 103 which faces the first substrate 101 is referred to as a first surface and a surface of the second layer 104 which is in contact with the second substrate 102 is referred to as a second surface, the functional panel 100 includes a plurality of regions having different distances between the first surface and the second surface.

For example, a distance 123, which is between the first surface and the second surface in a region 121 including the projecting portion 103B, is longer than a distance 124, which is between the first surface and the second surface in a region 122 around the region 121.

Although FIG. 1C shows an example in which the first substrate 101 is flat and the first adhesive layer 106 partly differs in thickness, a structure may also be used in which the thickness of the first adhesive layer 106 is uniform and the first substrate 101 waves. The structure is modified depending on the manufacturing methods.

The first layer 103 includes a region in contact with the second layer 104.

The pressure in the space surrounded by the first layer 103 and the second layer 104 or by the first layer 103, the second layer 104, and the sealing portion 105 is preferably lower than an atmospheric pressure. The pressure in the above space is preferably lower than or equal to 10 Pa, further preferably lower than or equal to 1 Pa.

<<First Substrate, Second Substrate>>

As the first substrate 101 or the second substrate 102, a substrate having at least heat resistance high enough to withstand process temperature in a fabrication process is used. As the first substrate 101 or the second substrate 102, for example, a glass substrate, a quartz substrate, a sapphire substrate, a semiconductor substrate, a ceramic substrate, a metal substrate, a resin substrate, or a plastic substrate can be used.

<<First Layer>>

There is no particular limitation on materials which can be used for the first layer 103. For example, a film including an insulating film and the projecting portion 103B stacked thereover can be used as the first layer 103. The first layer 103 includes a functional element. Note that in the case where the second layer 104 includes a functional element, the first layer 103 does not include a functional element in some cases.

In this embodiment, an insulating layer is used as a layer included in the first layer 103 which is in contact with the first adhesive layer 106.

The insulating layer which is in contact with the first adhesive layer 106 can have a structure including one film selected from a silicon nitride film, a silicon oxynitride film, a silicon oxide film, a silicon nitride oxide film, and the like, or a stacked structure of a plurality of films selected from them.

The insulating layer can be formed by a sputtering method, a plasma CVD method, a coating method, a printing method, or the like. For example, the insulating layer is formed at a temperature higher than or equal to 250° C. and lower than or equal to 400° C. by a plasma CVD method, whereby the insulating layer can be a dense film with very low water permeability. Note that the thickness of the insulating layer is preferably greater than or equal to 10 nm and less than or equal to 3000 nm, further preferably greater than or equal to 200 nm and less than or equal to 1500 nm.

<<Thin Film Portion, Projecting Portion>>

In this specification, a projecting portion is referred to as a portion which projects from the surrounding surface. The projecting portion preferably projects from the surrounding surface by longer than or equal to 100 nm, further preferably by longer than or equal to 500 nm. Note that when the layer waves as the first layer 103 in FIG. 1C, the projecting portion means a thicker portion. In that case, the projecting portion is preferably thicker than the surrounding film by greater than or equal to 100 nm, further preferably greater than or equal to 500 nm.

Portions other than the above projecting portion are referred to as thin film portions.

<<Functional Element>>

The first layer 103 includes a device having a function. A transistor, an organic EL element, a MEMS, or the like can be used as the device.

Note that a functional panel including the first layer 103 provided with a display element such as an organic EL element or a display element using a MEMS can be called a display panel.

For example, the first layer 103, which includes a plurality of light-emitting elements that emit white light, and the second layer 104, which is in contact with the first layer 103 and includes a color filter, can be used for the functional panel 100. In this structure, the gap between the light-emitting element and the color filter is eliminated or partly narrowed as compared to that in the conventional structure such as a structure in which an adhesive is filled between the light-emitting element and the color filter. No gap or a partly narrowed gap improves the viewing angle of the functional panel 100, reduces the light leakage from the adjacent pixel, and increases the reliability. In addition, there is no adhesive layer between the first layer and the second layer, reducing penetration of a resin or damage.

The first layer 103 and the second layer 104 are in contact with each other, whereby they can be electrically connected to each other.

For example, in the case where the first layer 103 is provided with an organic EL element including a cathode and an anode and the second layer 104 is provided with an auxiliary wiring, the cathode of the organic EL element provided in the first layer 103 or a wiring which is electrically connected to the cathode can be electrically connected to the wiring included in the second layer 104 in a contact region. Accordingly, the auxiliary wiring can reduce a voltage drop in the cathode of the organic EL element. Thus, the present invention can provide a novel functional panel.

<<Second Layer>>

There is no particular limitation on materials which can be used for the second layer 104. For example, a material which can be used for the first layer 103 can be used. The second layer 104 may include a functional element.

Any film such as an insulating film, a semiconductor film, and a metal film can be used as the second layer 104. The film used for the first layer 103 can be used as the second layer 104.

A region in which the first layer 103 and the second layer 104 are in contact with each other is provided, whereby they can be adhered to each other so as to be electrically connected, for example. A film which is difficult to form over the first layer 103 is formed as the second layer 104 and makes an electrical contact therebetween, which produces the same effect as that when the second layer 104 is formed directly on the first layer 103. For example, when an organic EL element is formed as a functional element of the first layer 103, a patterning treatment including a cleaning process with water or a resist peeling process, a high-temperature heat treatment, or the like is difficult to be performed after the first layer 103 is formed. However, the same effect as that when the second layer 104 is formed over the first layer 103 can be achieved in some cases in such a manner that the second layer 104 including a wiring and the like is formed by a patterning treatment including a cleaning process with water or a resist peeling process, a high-temperature heat treatment, or the like, and then a region in which the first layer 103 and the second layer 104 are in contact with each other is provided.

<<First Adhesive Layer>>

As the first adhesive layer 106, various curable adhesives such as a reactive curable adhesive, a thermosetting adhesive, an anaerobic adhesive, and a photo curable adhesive such as an ultraviolet curable adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred. Alternatively, a two-component-mixture-type resin may be used.

Further, the resin may include a drying agent. For example, a substance which adsorbs moisture by chemical adsorption, such as an oxide of an alkaline earth metal (e.g., calcium oxide and barium oxide), can be used. Alternatively, a substance which adsorbs moisture by physical adsorption, such as zeolite and silica gel, may be used. The drying agent is preferably included, in which case it can suppress deterioration of the functional element due to entry of moisture in the air and can improve the reliability of the device.

In addition, a filler with a high refractive index or a light scattering member is mixed into the resin, whereby the efficiency of light extraction from the light-emitting element can be improved. For example, titanium oxide, barium oxide, zeolite, zirconium, or the like can be used.

<<Sealing Portion, First Partition>>

For the sealing portion 105 and the first partition 107, materials which can be used for the first adhesive layer 106 can be used. Different materials can be used for the sealing portion 105 and the first partition 107.

<Structure example 1-2 of functional panel>

Figure 3A:
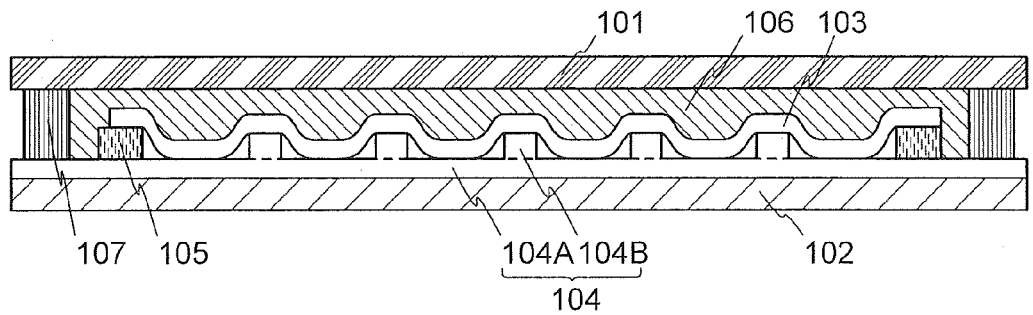
FIGS. 3A to 3D each illustrate a functional panel of an embodiment.

Although the first layer 103 includes the thin film portion 103A and the projecting portion 103B in the structure example 1-1, the second layer 104 may include a thin film portion 104A and a projecting portion 104B as shown in FIG. 3A. Note that the dotted lines in the second layer 104 in the drawing represent the boundaries between the thin film portion 104A and the projecting portion 104B.

<Structure example 1-3 of functional panel>

Figure 3B:
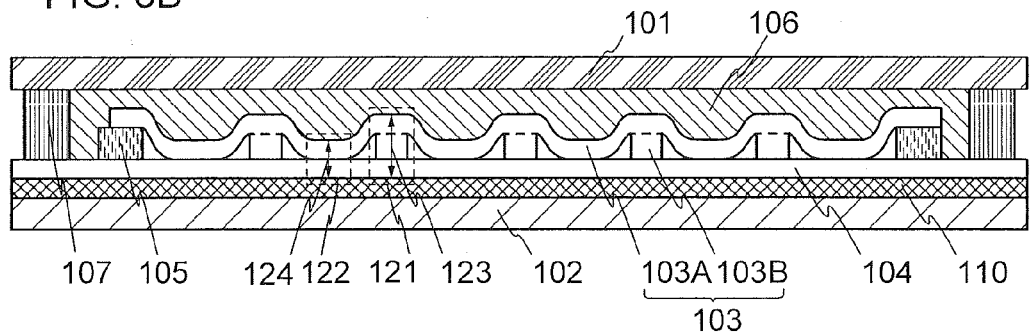

FIG. 3B illustrates a structure of a functional panel of one embodiment of the present invention.

The functional panel in FIG. 3B includes a first substrate 101, a second substrate 102, a first layer 103, a second layer 104, a third layer 110, a sealing portion 105, a first adhesive layer 106, and a first partition 107. The first layer 103 includes a thin film portion 103A and a projecting portion 103B.

There is no particular limitation on materials which can be used for the third layer 110. For example, a material which can be used for the first layer 103 can be used. The third layer 110 may include a functional element.

The first layer 103 and the second layer 104 are bonded to each other with a sealing portion 105 provided therebetween. The sealing portion 105 is provided surrounding at least one of the projecting portions 103B.

The first adhesive layer 106 is between the first layer 103 and the first substrate 101. The third layer 110 is between the second layer 104 and the second substrate 102. The first partition 107 is provided surrounding the first adhesive layer 106.

When a surface of the first layer 103 which faces the first substrate 101 is referred to as a first surface and a surface of the second layer 104 which faces the second substrate 102 is referred to as a second surface, the functional panel 100 includes a plurality of regions having different distances between the first surface and the second surface.

For example, a distance 123, which is between the first surface and the second surface in a region 121 including the projecting portion 103B, is longer than a distance 124, which is between the first surface and the second surface in a region 122 around the region 121.

Although FIG. 3B shows an example in which the first substrate 101 is flat and the first adhesive layer 106 partly differs in thickness, a structure may also be used in which the thickness of the first adhesive layer 106 is uniform and the first substrate 101 is waved. The structure is changed depending on the manufacturing method.

The first layer 103 includes a region in contact with the second layer 104.

<Structure example 1-4 of functional panel>

Figure 3C:
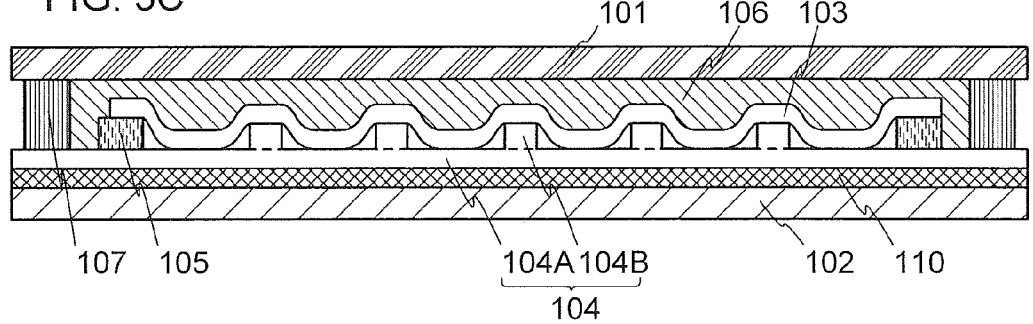

Although the first layer 103 includes the thin film portion 103A and the projecting portion 103B in the structure example 1-3, the second layer 104 may include a thin film portion 104A and a projecting portion 104B as shown in FIG. 3C.

<Structure example 2 of functional panel>

Figure 2A:
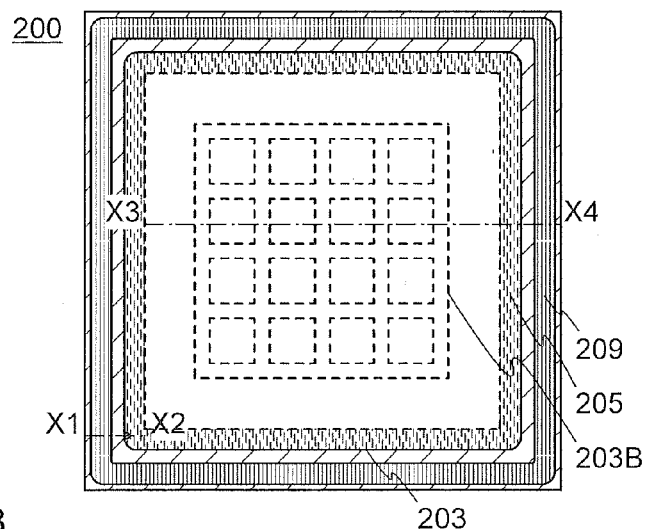
FIGS. 2A to 2C illustrate functional panels of an embodiment.
Figure 2B:
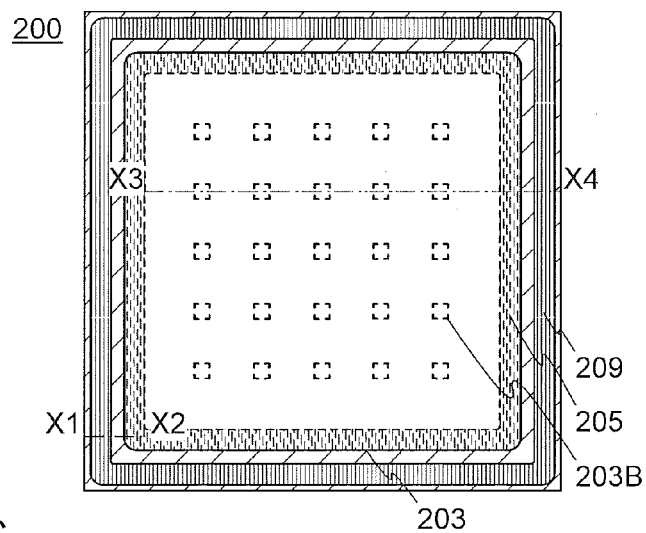
Figure 2C:
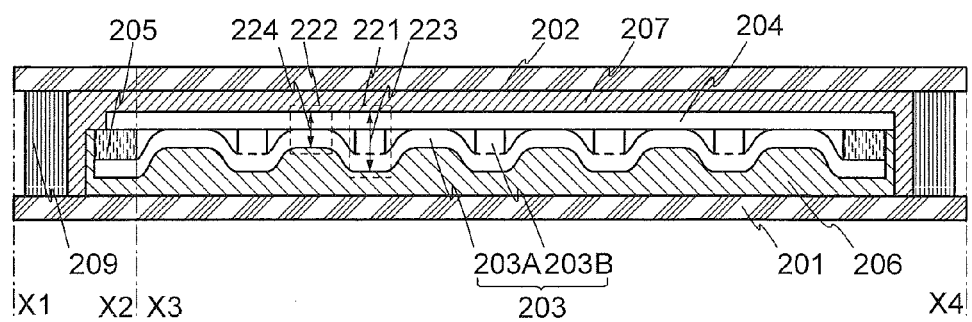

FIGS. 2A to 2C illustrate the structures of functional panels of one embodiment of the present invention. FIGS. 2A and 2B each are a top view of a functional panel 200 of one embodiment of the present invention, and FIG. 2C is a cross-sectional view taken along lines X1-X2 and X3-X4 in FIG. 2A.

The functional panel 200 includes a first substrate 201, a second substrate 202, a first layer 203, a second layer 204, a sealing portion 205, a first adhesive layer 206, a second adhesive layer 207, and a second partition 209. The first layer 203 includes a thin film portion 203A and a projecting portion 203B. Note that the dotted lines in the first layer 203 in the drawing represent boundaries between the thin film portion 203A and the projecting portion 203B.

The projecting portion 203B can have a variety of geometrical shapes. For example, the number of projecting portions 203B can be one or more. Specifically, the projecting portion 203B can have a lattice structure (see FIG. 2A). The projecting portion 203B can have island structures (see FIG. 2B).

The first layer 203 and the second layer 204 are bonded to each other with a sealing portion 205 provided therebetween. For example, the sealing portion 205 is provided surrounding at least one of the projecting portions 203B.

The first adhesive layer 206 is between the first layer 203 and the first substrate 201. The second adhesive layer 207 is between the second layer 204 and the second substrate 202. The second partition 209 is provided surrounding the second adhesive layer 207.

When a surface of the first layer 203 which faces the first substrate 201 is referred to as a first surface and a surface of the second layer 204 which faces the second substrate 202 is referred to as a second surface, the functional panel 200 includes a plurality of regions having different distances between the first surface and the second surface.

For example, a distance 223, which is between the first surface and the second surface in a region 221 including the projecting portion 203B, is longer than a distance 224, which is between the first surface and the second surface in a region 222 around the region 221.

Figure 3D:
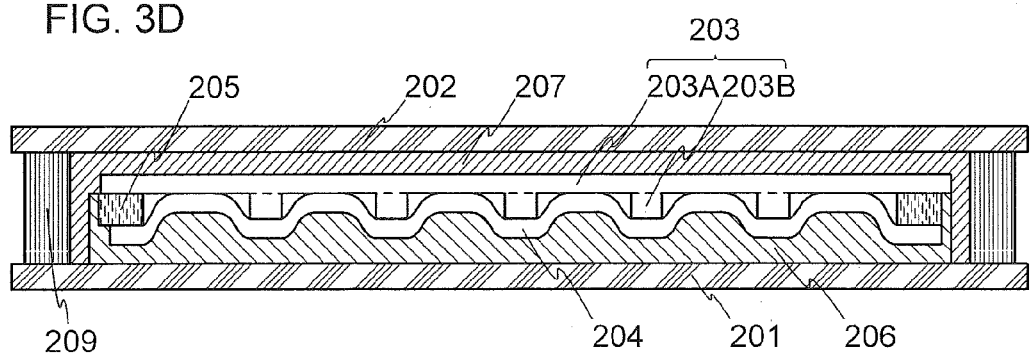
Figure 5A:
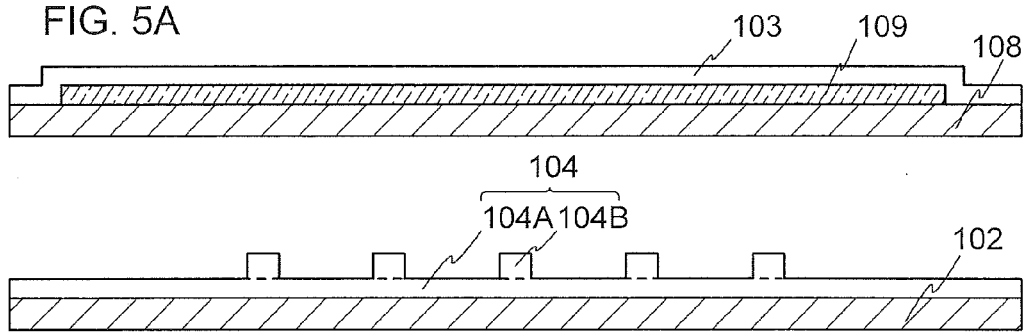
FIGS. 5A to 5E illustrate a method for manufacturing a functional panel of an embodiment.
Figure 5B:
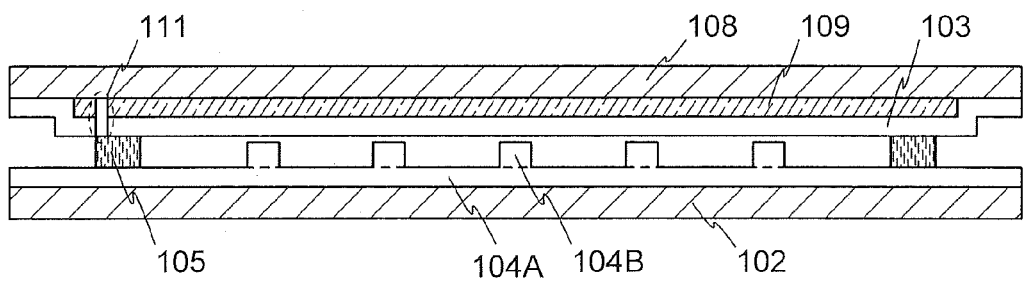
Figure 5C:
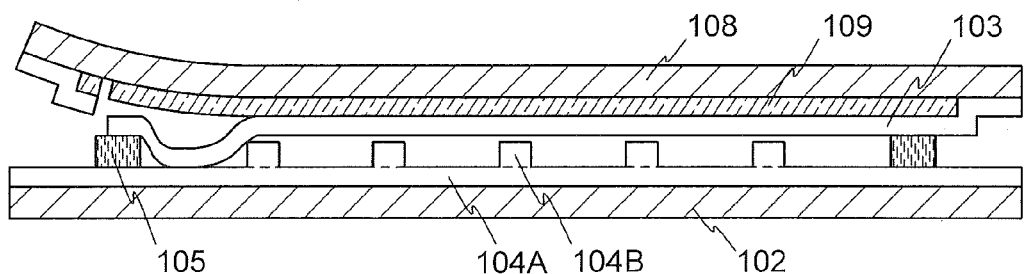
Figure 5D:
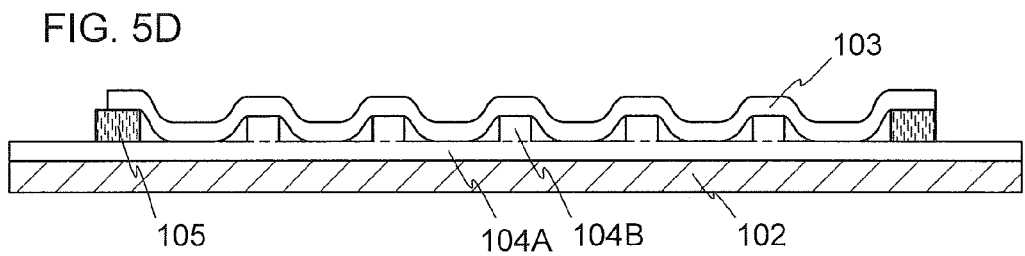
Figure 5E:
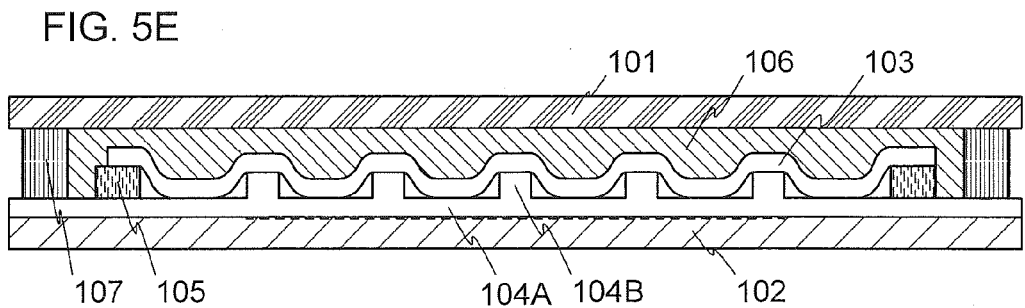

Although FIG. 2C shows a structure in which the first layer 203 waves, a structure may also be used in which the second layer 204 waves as shown in FIG. 3D.

Materials which can be used for the first substrate 101 can be used for the first substrate 201. Additionally, materials which can be used for the second substrate 102, the first layer 103, and the second layer 104 can be used for the second substrate 202, the first layer 203, and the second layer 204, respectively.

For the first adhesive layer 206, the adhesive layer 207, the second partition 209, and the sealing portion 205, materials which can be used for the first adhesive layer 106 can be used. Different materials can be used for the first adhesive layer 206, the adhesive layer 207, the second partition 209, and the sealing portion 205.

This embodiment can be combined with any of the other embodiments in this specification as appropriate.

Embodiment 2

<Manufacturing Method 1-1 of Functional Panel>

A manufacturing method 1-1 of a functional panel includes the four steps described below.

<<First Step>>

A first formation substrate 108 which is provided with the first layer 103 with a first peeling layer 109 positioned therebetween is prepared. The second substrate 102 including a region which is in contact with the second layer 104 is prepared (FIG. 4A).

For example, the first peeling layer 109 is formed over the first formation substrate 108. Although an example in which the first peeling layer 109 is formed to have an island shape is described here, one embodiment of the present invention is not limited to this example.

The first layer 103 including the thin film portion 103A and the projecting portion 103B is formed over the first peeling layer 109. The first layer 103 may be formed to have an island shape.

A material with which the first layer 103 can be peeled from the first formation substrate 108 is selected and used for the first layer 103 and the first peeling layer 109. For example, a material is selected so that the first layer 103 can be peeled at the interface between the first formation substrate 108 and the first peeling layer 109 or at the interface between the first peeling layer 109 and the first layer 103 or the first layer 103 can be peeled by breaking the first peeling layer 109 itself.

Although an example in which the first layer 103 is peeled at the interface between the first layer 103 and the first peeling layer 109 is described in this embodiment, one embodiment of the present invention is not limited to such an example depending on a material used for the first peeling layer 109 or the first layer 103.

For example, in the case where a tungsten film, a tungsten oxide film, and the first layer 103 are stacked in this order, a layer including the first layer 103 can be peeled at the interface between the tungsten film and the tungsten oxide film (or in the vicinity of the interface). Note that part of the first peeling layer 109 (here, the tungsten oxide film) remains on the side of the layer including the first layer 103 in some cases. The first peeling layer 109 remaining on the first layer 103 side may be removed after that.

For example, a structure in which the first peeling layer 109 as well as the first layer 103 is peeled at the interface between the first formation substrate 108 and the first peeling layer 109 can be used. Specifically, a glass plate is used as the first formation substrate 108 and polyimide can be used for the first peeling layer 109.

<<First Formation Substrate>>

As the first formation substrate 108, various substrates that can be used as the first substrate 101 can be used. Alternatively, a flexible substrate such as a film may be used.

Note that a large-sized glass substrate is preferably used as the first formation substrate 108 in terms of productivity. For example, a glass substrate having any of the following sizes or a larger size can be used: the 3rd generation (550 mm×650 mm), the 3.5th generation (600 mm×720 mm or 620 mm×750 mm), the 4th generation (680 mm×880 mm or 730 mm×920 mm), the 5th generation (1100 mm×1300 mm), the 6th generation (1500 mm×1850 mm), the 7th generation (1870 mm×2200 mm), the 8th generation (2200 mm×2400 mm), the 9th generation (2400 mm×2800 mm or 2450 mm×3050 mm), and the 10th generation (2950 mm×3400 mm).

In the case where a glass substrate is used as the first formation substrate 108, as a base film, an insulating film such as a silicon oxide film, a silicon oxynitride film, a silicon nitride film, or a silicon nitride oxide film is preferably formed between the first formation substrate 108 and the first peeling layer 109, in which case contamination from the glass substrate can be prevented.

<<First Peeling Layer>>

The first peeling layer 109 can be formed using an element selected from tungsten, molybdenum, titanium, tantalum, niobium, nickel, cobalt, zirconium, zinc, ruthenium, rhodium, palladium, osmium, iridium, and silicon; an alloy material containing any of the elements; a compound material containing any of the elements; or the like. A crystal structure of a layer containing silicon may be amorphous, microcrystal, or polycrystal. Furthermore, a metal oxide such as aluminum oxide, gallium oxide, zinc oxide, titanium dioxide, indium oxide, indium tin oxide (ITO), indium zinc oxide, or an In—Ga—Zn oxide can be used. The first peeling layer 109 is preferably formed using a high-melting point metal material such as tungsten, titanium, or molybdenum, in which case the degree of freedom of the process for forming the first layer 103 can be increased.

The first peeling layer 109 can be formed by, for example, a sputtering method, a plasma CVD method, a coating method (including a spin coating method, a droplet discharging method, a dispensing method, and the like), a printing method, or the like. The thickness of the first peeling layer 109 is, for example, greater than or equal to 10 nm and less than or equal to 200 nm, or preferably greater than or equal to 20 nm and less than or equal to 100 nm.

In the case where the first peeling layer 109 has a single-layer structure, a tungsten layer, a molybdenum layer, or a layer containing a mixture of tungsten and molybdenum is preferably formed. Alternatively, a layer containing an oxide or an oxynitride of tungsten, a layer containing an oxide or an oxynitride of molybdenum, or a layer containing an oxide or an oxynitride of a mixture of tungsten and molybdenum may be formed. Note that the mixture of tungsten and molybdenum is an alloy of tungsten and molybdenum, for example.

In the case where the first peeling layer 109 is formed to have a stacked-layer structure including a layer containing tungsten and a layer containing an oxide of tungsten, the layer containing an oxide of tungsten may be formed as follows: the layer containing tungsten is formed first and an insulating film formed of an oxide is formed thereover, so that the layer containing an oxide of tungsten is formed between the tungsten layer and the insulating film.

The surface of the layer including tungsten may be subjected to a surface oxidation treatment, so that a layer including an oxide of tungsten is formed.

For example, thermal oxidation treatment, oxygen plasma treatment, nitrous oxide ($N_2O$) plasma treatment, treatment with a highly oxidizing solution such as ozone water, or the like can be used as the surface oxidation treatment. Alternatively, plasma treatment or heat treatment may be performed in an atmosphere of oxygen, nitrogen, or nitrous oxide alone, or a mixed gas of any of these gasses and another gas. Surface condition of the first peeling layer 109 is changed by the plasma treatment or heat treatment, whereby adhesion between the first peeling layer 109 and an insulating layer formed later can be controlled.

Note that the layer to be peeled may be peeled at the interface between the formation substrate and the layer to be peeled. For example, a glass substrate is used as the formation substrate, and an organic resin such as polyimide, polyester, polyolefin, polyamide, polycarbonate, or acrylic which is formed in contact with the glass substrate can be used as the layer to be peeled. Note that an insulating film, a transistor, a light-emitting element, or the like can be formed over the organic resin. The layer to be peeled corresponds to the first layer 103 here.

For example, locally heating the organic resin by laser light or the like enables the organic resin to be peeled at the interface between the formation substrate and the organic resin. Alternatively, peeling of the organic resin at the interface between a metal layer and the organic resin may be performed in the following manner the metal layer is provided between the formation substrate and the organic resin and current is made to flow in the metal layer so that the metal layer is heated.

Note that the peeled organic resin can be used as a substrate supporting an insulating film, a transistor, a light-emitting element, or the like provided over the organic resin. Alternatively, the organic resin may be attached to another substrate with an adhesive.

As a method for preparing the second substrate 102 supporting the second layer 104, the second layer 104 is formed over the second substrate 102, for example. Either an organic film or an inorganic film may be used as the second layer 104 (FIG. 4A). Although the second layer 104 is formed over the entire surface of the second substrate 102 in FIG. 4A, the second layer 104 may have an island shape.

<<Second Step>>

A sealant is formed on the first layer 103 so as to surround at least one of the projecting portions 103B, for example.

The sealant may be formed over the second layer 104. In that case, the sealing portion 105 is formed so as to surround the projecting portion 103B of the first layer 103 in bonding.

Next, the first layer 103 and the second layer 104 are bonded to each other with the sealant, so that the sealing portion 105 is formed (FIG. 4B).

The first layer 103 and the second layer 104 are bonded to each other in a reduced pressure atmosphere. The pressure in the reduced pressure atmosphere is lower than an atmospheric pressure. The pressure in the reduced pressure atmosphere is preferably lower than or equal to 10 Pa, further preferably lower than or equal to 1 Pa, for example.

<<Third Step>>

Next, the pressure in the atmosphere is made to be higher than that of the reduced pressure atmosphere of the second step. Then, the first layer 103 is peeled from the first peeling layer 109. For example, the peeling can be performed in an atmospheric pressure atmosphere or a pressured atmosphere.

As a method for peeling the first layer 103 from the first peeling layer 109, a method in which a separation trigger 111 is formed and the peeling is performed from the separation trigger can be used. Specifically, the separation trigger can be formed by a laser light irradiation method or the like (FIG. 4B).

Note that a point where part of the first layer 103 is peeled from the first peeling layer 109 is referred to as a separation trigger in this specification. For example, the separation trigger can be formed by a break or a crack formed in an interface layer (a layer included in the first layer 103 that is in contact with the first peeling layer 109).

At this time, not only the interface layer but also the other layers included in the first layer 103, the first peeling layer 109, or part of the sealing portion 105 may be removed.

Specifically, the separation trigger can be formed in such a manner that part of the film is melted, evaporated, or thermally broken by laser light irradiation.

Alternatively, the separation trigger can be formed by shaving with a sharp knife or the like.

Note that the pressure in the space surrounded by the first layer 103, the second layer 104, and the sealing portion 105 is lower than that of the atmosphere in which the peeling is performed. The above pressure difference adds stress to the surface of the first layer 103 from which the first formation substrate 108 is peeled in a region where the peeling of the first formation substrate 108 is already performed while the peeling progresses. As a result, regions having different distances between the first surface and the second surface are formed. In addition, a region in which the first layer 103 is in contact with the second layer 104 is formed (FIG. 4C).

Through the third step, the first layer 103 can be transferred to the second substrate 102 from the first formation substrate 108 (FIG. 4D). Note that one of the substrates is preferably fixed to a suction stage or the like. For example, the first formation substrate 108 may be fixed to a suction stage to peel the first layer 103 from the first formation substrate 108. Alternatively, the second substrate 102 may be fixed to a suction stage to peel the first formation substrate 108 from the second substrate 102.

For example, the first layer 103 and the first formation substrate 108 may be separated by mechanical force (a peeling process with a human hand or a gripper, a peeling process by rotation of a roller, or the like) by utilizing the separation trigger. The peeling step is preferably performed with an apparatus capable of performing the peeling automatically.

The first formation substrate 108 and the first layer 103 may be separated by filling the interface between the first peeling layer 109 and the first layer 103 with liquid such as water. A portion between the first peeling layer 109 and the first layer 103 absorbs a liquid through capillarity action, so that the first peeling layer 109 can be separated easily. Furthermore, an adverse effect on the functional element included in the first layer 103 due to static electricity caused at separation (e.g., a phenomenon in which a semiconductor element is damaged by static electricity) can be suppressed.

<<Fourth Step>>

The exposed first layer 103 is interposed between the second substrate 102 and the first substrate 101, the first layer 103 and the first substrate 101 are bonded to each other with the first adhesive layer 106, and the first adhesive layer 106 is cured (FIG. 4E).

In this embodiment, a frame-shaped first partition 107 is provided to limit expansion of a liquid material to be a first adhesive layer 106, and the first layer 103 and the first substrate 101 are bonded to each other with the liquid material to be the first adhesive layer 106 dropped inside the first partition 107.

Note that the first partition 107 is provided to limit the range of the first adhesive layer 106, and the first partition 107 is not necessarily provided if the first adhesive layer 106 is provided in a limited region. For example, a first sheet-like adhesive layer 106 can be used.

In the case where the first substrate 101 and the second substrate 102 are attached to a flat substrate support for the bonding process, the first substrate 101 is flat and the first adhesive layer 106 partly has different thicknesses as shown in FIG. 4E. In the case where the first substrate 101 and the second substrate 102 are bonded to each other through two rollers to which pressure is added, the first adhesive layer 106 has a uniform thickness and the first substrate 101 waves in some cases.

The functional panel can be manufactured using a method for manufacturing a functional panel of one embodiment of the present invention including the first to fourth steps. An adhesive layer filled into the space between the first layer 103 and the second layer 104 is not needed, so that the material for the adhesive layer is not required, which lead's to resource saving and cost reduction. Furthermore, since the first layer 103 and the second layer 104 are bonded to each other only in a sealing portion, the process can be simplified, which can reduce the cost in the manufacturing process.

<Manufacturing Method 1-2 of Functional Panel>

Although the first layer 103 includes the thin film portion 103A and the projecting portion 103B in the manufacturing method 1-1, the second layer 104 may include the thin film portion 104A and the projecting portion 104B (FIGS. 5A to 5E).

<Manufacturing Method 1-3 of Functional Panel>

A manufacturing method 1-3 of a functional panel includes the four steps described below.

<<First Step>>

A first formation substrate 108 which is provided with the first layer 103 with the first peeling layer 109 positioned therebetween is prepared. The second substrate 102 which is provided with the second layer 104 with the third layer 110 positioned therebetween is prepared (FIG. 6A).

For example, the first peeling layer 109 is formed over the first formation substrate 108, and the first layer 103 including the thin film portion 103A and the projecting portion 103B is formed over the first peeling layer 109. The third layer 110 is formed over the second substrate 102, and the second layer 204 is formed over the third layer 110.

<<Second to Fourth Steps>>

The same steps as those described in the manufacturing method 1-1 of the functional panel can be applied to the second to fourth steps (FIGS. 6B to 6E).

<Manufacturing Method 1-4 of Functional Panel>

Although the first layer 103 includes the thin film portion 103A and the projecting portion 103B in the manufacturing method 1-3, the second layer 104 may include the thin film portion 104A and the projecting portion 104B (FIGS. 7A to 7E).

<Manufacturing Method 2 of Functional Panel>

A manufacturing method 2 of a functional panel includes the six steps described below.

<<First Step>>

Figure 8A:
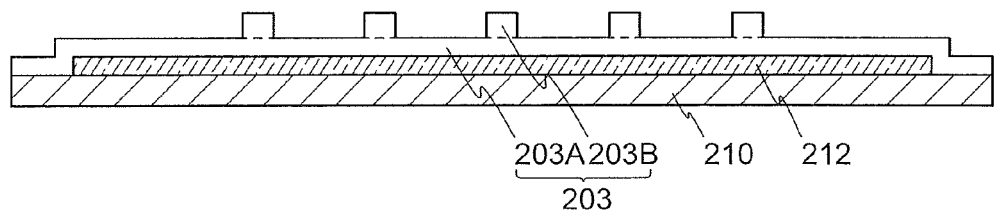
FIGS. 8A to 8D illustrate a method for manufacturing a functional panel of an embodiment.

A first formation substrate 210 which is provided with the first layer 203 with a first peeling layer 212 positioned therebetween and a second formation substrate 211 which is provided with the second layer 204 with a second peeling layer 213 positioned therebetween are prepared (FIG. 8A).

For example, the first peeling layer 212 is formed over the first formation substrate 210, and the first layer 203 including the thin film portion 203A and the projecting portion 203B is formed over the first peeling layer 212. The second peeling layer 213 is formed over a second formation substrate 211, and the second layer 204 is formed over the second peeling layer 213.

For the first formation substrate 210 and the second formation substrate 211, materials which can be used for the first formation substrate 108 can be used. For the first peeling layer 212 and the second peeling layer 213, materials which can be used for the first peeling layer 109 can be used. Different materials can be used for the first formation substrate 210 and the second formation substrate 211, and the first peeling layer 212 and the second peeling layer 213.

<<Second Step>>

A sealant is formed on the first layer 203 so as to surround at least one of the projecting portions 203B.

The sealant may be formed over the second layer 204. In that case, a sealing portion 205 is formed so as to surround the projecting portion 203B of the first layer 203 in bonding.

Figure 8B:
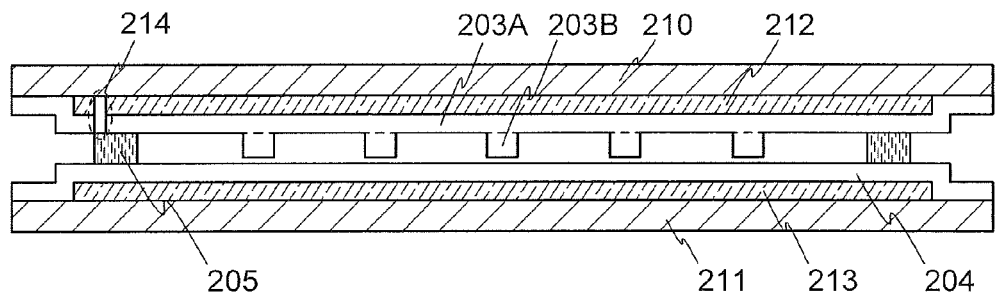

Next, the first formation substrate 210 and the second formation substrate 211 are bonded to each other with the sealant so that the first layer 203 faces the second layer 204 and the sealing portion 205 is formed (FIG. 8B).

The first formation substrate 210 and the second formation substrate 211 are bonded to each other in a reduced pressure atmosphere. The pressure in the reduced pressure atmosphere is preferably lower than or equal to 10 Pa, further preferably lower than or equal to 1 Pa.

Although FIG. 8B illustrates the case where the first peeling layer 212 and the second peeling layer 213 have the same size, peeling layers with different sizes may be used.

<<Third Step>>

Next, a separation trigger 214 is formed by laser light irradiation (FIG. 8B).

Whichever the first formation substrate 210 or the second formation substrate 211 may be peeled first. In the case where the peeling layers differ in size, a substrate over which a larger peeling layer is formed may be peeled first or a substrate over which a smaller peeling layer is formed may be peeled first. In the case where an element such as a semiconductor element, a light-emitting element, or a display element is formed only over one of the substrates, the substrate on the side of which the element is formed over may be peeled first or the other substrate may be peeled first. Here, an example in which the first formation substrate 210 is peeled first is described.

A region where the cured sealing portion 205, the first layer 203, and the first peeling layer 212 overlap with each other is irradiated with laser light.

The separation trigger 214 can be formed in such a manner that part of an interface layer (the layer included in the first layer 203 that is in contact with the first peeling layer 212) is removed. At this time, not only the interface layer but also the other layers included in the first layer 203, the first peeling layer 212, or part of the sealing portion 205 may be removed.

Laser light irradiation is preferably performed from the substrate side provided with the peeling layer which is desirably peeled. When a region where the first peeling layer 212 and the second peeling layer 213 overlap with each other is irradiated with laser light, a crack is formed only in the first layer 203, not both of the first layer 203 and the second layer 204, so that the first formation substrate 210 and the first peeling layer 212 can be selectively peeled.

In the case where the region where the first peeling layer 212 and the second peeling layer 213 overlap with each other is irradiated with laser light, separation triggers formed in both the first layer 203 on the first peeling layer 212 side and the second layer 204 on the second peeling layer 213 side might make it difficult to peel one of the formation substrates selectively. Therefore, laser light irradiation conditions might be restricted so that only one of the layers to be peeled is cracked.

The first layer 203 and the first formation substrate 210 are separated from a separation trigger 214. The peeling is performed in a pressure higher than the reduced pressure atmosphere in which the bonding is performed. For example, the peeling can be performed in an atmospheric pressure atmosphere or a pressured atmosphere.

Figure 8C:
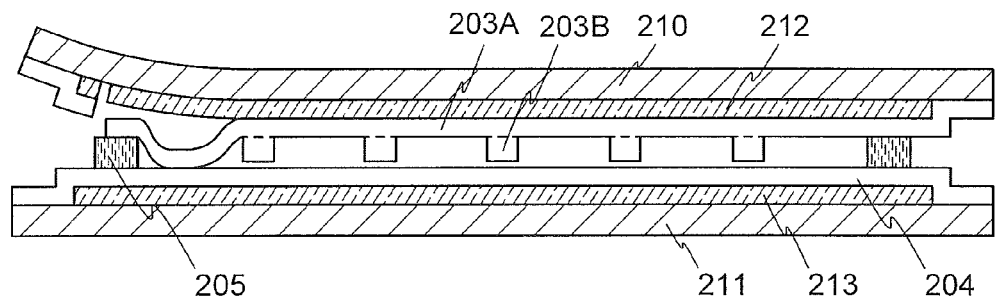

Note that the pressure in the space surrounded by the first layer 203, the second layer 204, and the sealing portion 205 is lower than that of the atmosphere in which the peeling is performed. The above pressure difference adds stress to the surface of the first layer 203 from which the first formation substrate 210 is peeled in a region where the peeling of the first formation substrate 210 is already performed while the peeling progresses. As a result, regions having different distances between the first surface and the second surface are formed. In addition, a region in which the first layer 203 is in contact with the second layer 204 is formed (FIG. 8C).

Figure 8D:
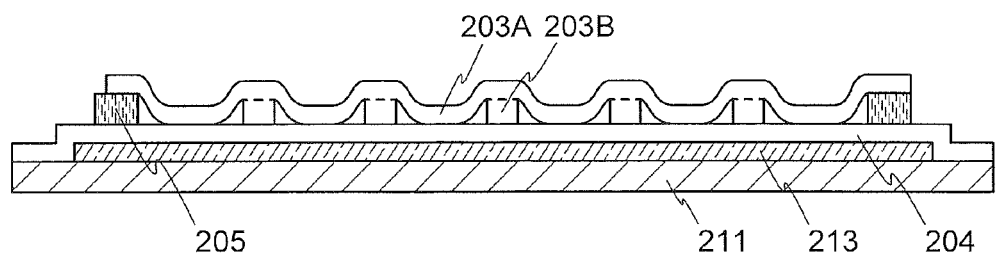

Accordingly, the first layer 203 can be transferred to the second formation substrate 211 from the first formation substrate 210 (FIG. 8D).

<<Fourth Step>>

Figure 9A:
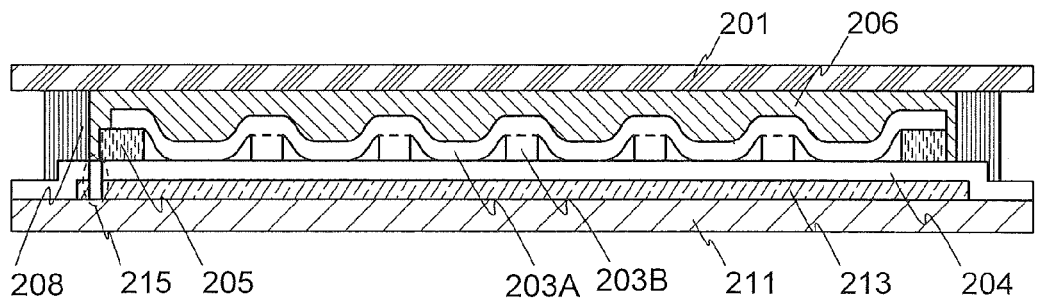
FIGS. 9A to 9D illustrate a method for manufacturing a functional panel of an embodiment.

The exposed first layer 203 is interposed between the second formation substrate 211 and the first substrate 201, the first layer 203 and the first substrate 201 are bonded to each other with the first adhesive layer 206, and the first adhesive layer 206 is cured (FIG. 9A). Here, a frame-shaped first partition 208 is provided to limit expansion of a liquid material to be a first adhesive layer 206, and the first layer 203 and the first substrate 201 are bonded to each other with the liquid material to be the first adhesive layer 206 dropped inside the first partition 208. The materials which can be used for the first adhesive layer 106 can be used for the first partition 208.

Next, a separation trigger 215 is formed by laser light irradiation.

A region where the first cured adhesive layer 206 and the sealing portion 205 overlap with each other, or where the first cured partition 208, the second layer 204, and the second peeling layer 213 overlap with each other is irradiated with laser light. An example in which the first adhesive layer 206 is in a cured state and the first partition 208 is not in a cured state is described here, and the first cured adhesive layer 206 is irradiated with laser light.

The separation trigger can be formed in such a manner that part of an interface layer (the layer included in the second layer 204 that is in contact with the second peeling layer 213) is removed. At this time, not only the interface layer but also the other layers included in the second layer 204, the second peeling layer 213, or part of the first adhesive layer 206 may be removed.

Laser light irradiation is preferably performed from the side of the second formation substrate 211 provided with the second peeling layer 213.

<<Fifth Step>>

Figure 9B:
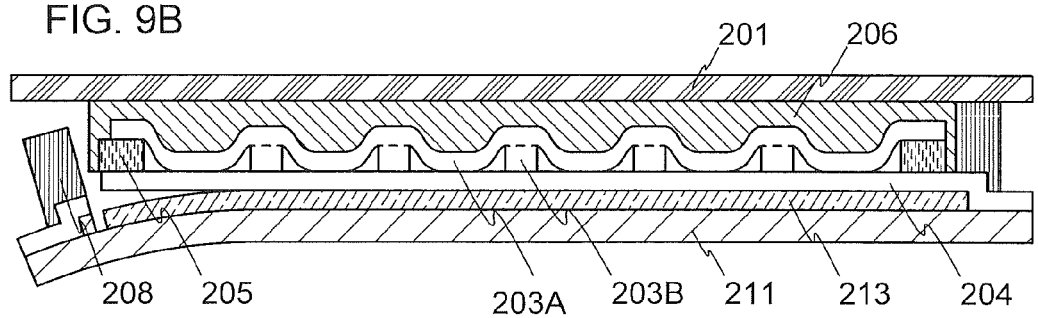
Figure 9C:
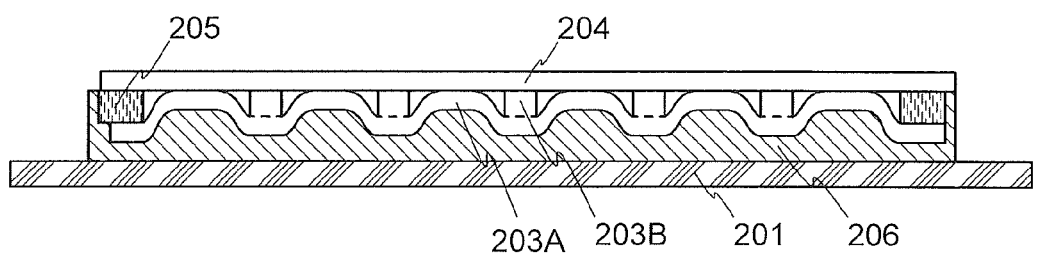

The second layer 204 and the second formation substrate 211 are peeled from the separation trigger 215 (FIGS. 9B and 9C). Accordingly, the first layer 203 and the second layer 204 can be transferred to the first substrate 201.

<<Sixth Step>>

Figure 9D:
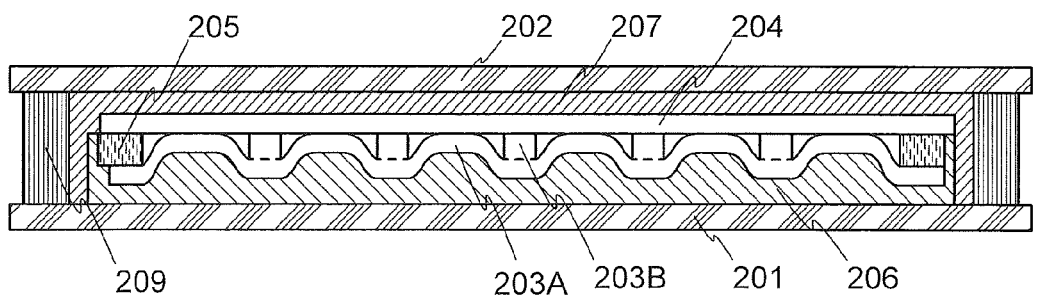

The exposed second layer 204 is interposed between the first substrate 201 and the second substrate 202, the second layer 204 and the second substrate 202 are bonded to each other with the second adhesive layer 207, and the second adhesive layer 207 is cured (FIG. 9D). Here, a frame-shaped second partition 209 is provided to limit expansion of a liquid material to be a second adhesive layer 207, and the second layer 204 and the second substrate 202 are bonded to each other with the liquid material to be the second adhesive layer 207 dropped inside the second partition 209.

An adhesive layer filled into the space between the first layer 203 and the second layer 204 is not needed in the above peeling method of one embodiment of the present invention, so that the material for the adhesive layer is not required, which leads to resource saving and cost reduction. The step for forming the adhesive layer can be reduced, so that the number of steps can be reduced, which can reduce the cost in the manufacturing process.

This embodiment can be combined with any of the other embodiments in this specification as appropriate.

Embodiment 3

In this embodiment, a structure of a display module of one embodiment of the present invention which can be used for an input/output device will be described with reference to FIGS. 10A and 10B, FIGS. 11A and 11B, and FIG. 12.

FIGS. 10A and 10B, FIGS. 11A and 11B, and FIG. 12 illustrate a structure of a display module of one embodiment of the present invention.

Figure 10A:
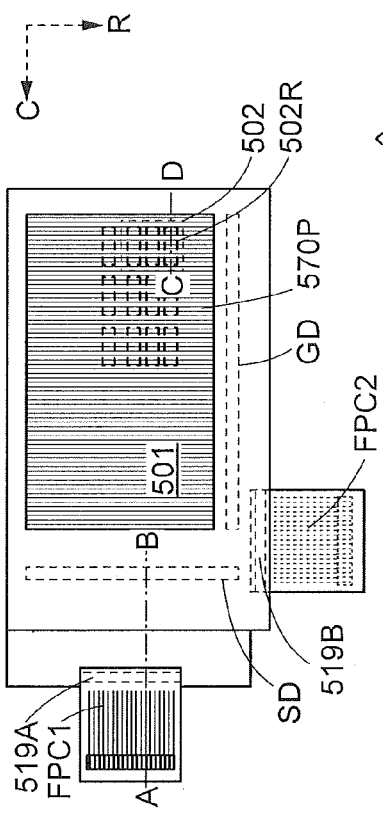
FIGS. 10A and 10B illustrate structures of a display module of an embodiment.
Figure 10B:
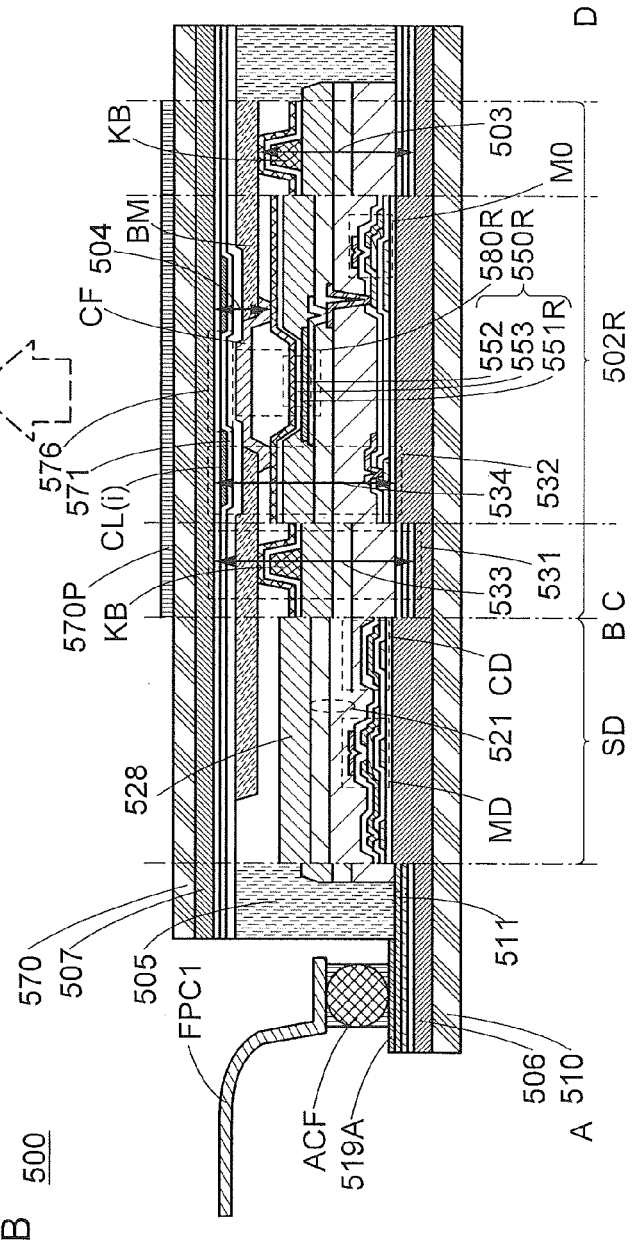
Figure 11A:
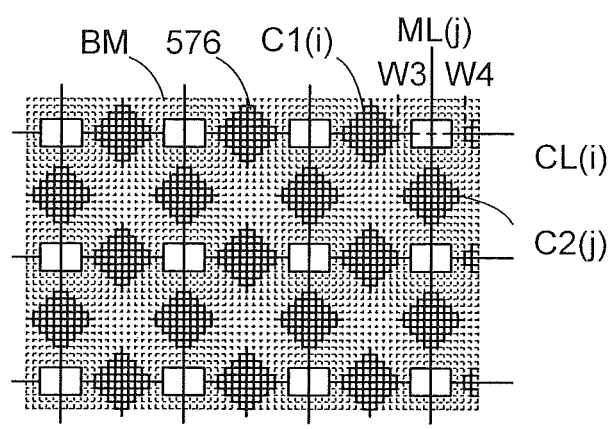
FIGS. 11A and 11B illustrate structures of a display module of an embodiment.
Figure 11B:
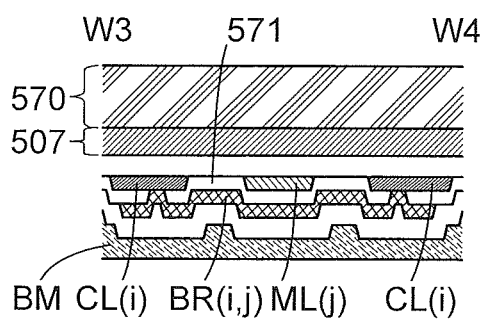

FIG. 10A is a top view of a display module 500 of one embodiment of the present invention, and FIG. 10B is a cross-sectional view taken along lines A-B and C-D in FIG. 10A. FIG. 11A is a top view illustrating a structure of part of the display module 500, and FIG. 11B is a cross-sectional view taken along line W3-W4 in FIG. 11A.

Figure 12:
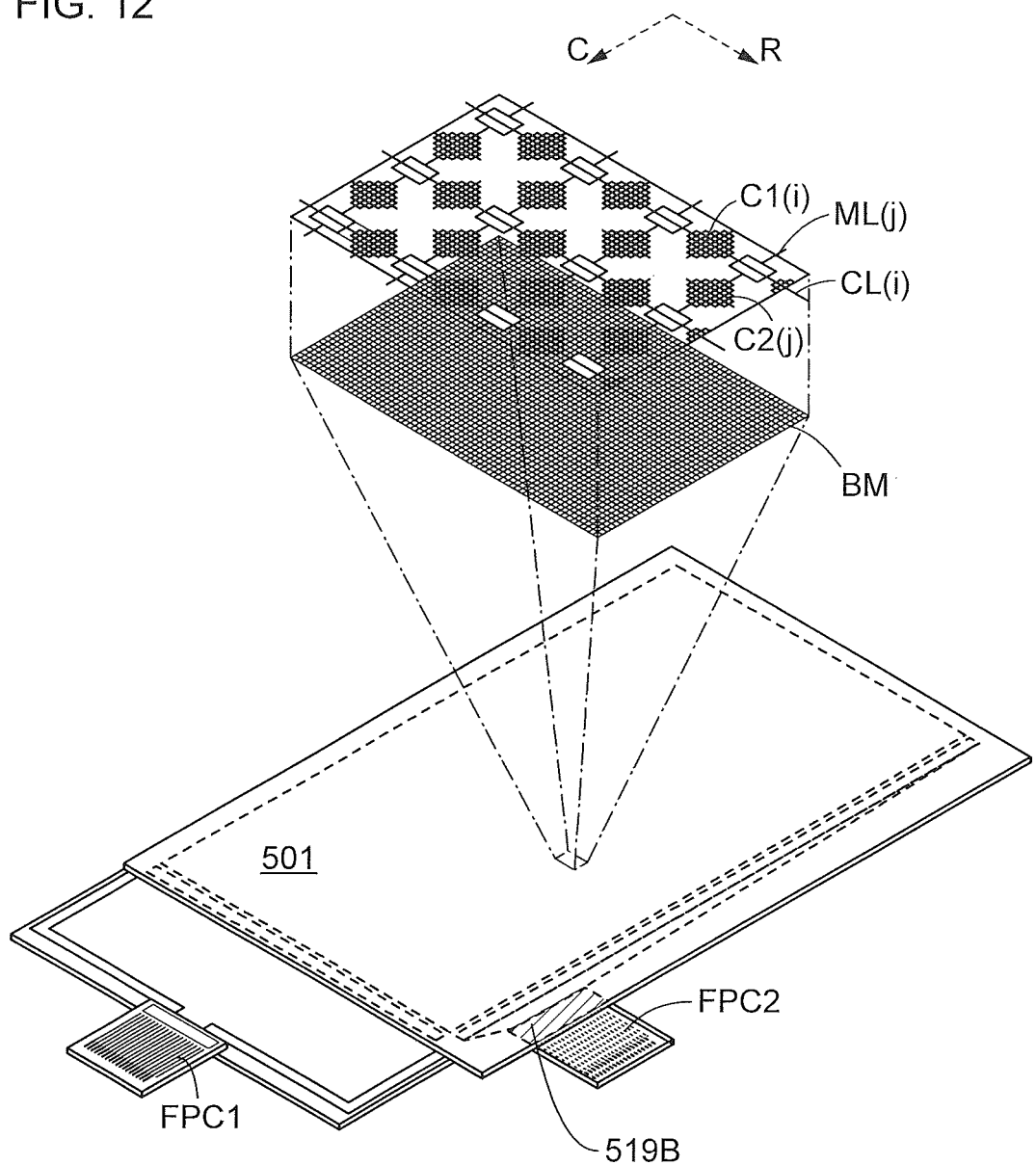
FIG. 12 illustrates a structure of a display module of an embodiment.

FIG. 12 is a projection view illustrating the display module 500 of one embodiment of the present invention. Note that part of the display module 500 is enlarged for convenience of description.

<Structure example of display module>

The display module 500 of one embodiment of the present invention includes a first terminal portion 519A; a first flexible substrate 510 which supports the first terminal portion 519A; a second flexible substrate 570 which has a region overlapping with the first substrate 510 and includes a second terminal portion 519B; a first layer 503 which includes a transistor MD, a transistor M0, a display element 550R, a spacer KB, and the like; a second layer 504 which includes a coloring layer CF, a light-blocking layer BM, a sensing element, and the like; a sealing portion 505; a first adhesive layer 506 which is provided between the first substrate 510 and the first layer 503; and a second adhesive layer 507 which is provided between the second substrate 570 and the second layer 504 (see FIGS. 10A and 10B).

The display module 500 of one embodiment of the present invention includes a display portion. The display portion includes a display element 550R between the first substrate 510 and the second substrate 570, the first terminal portion 519A electrically connected to the display element 550R, and a first flexible printed circuit FPC1 electrically connected to the first terminal portion 519A.

The display module 500 of one embodiment of the present invention further includes a sensing portion. The sensing portion includes a touch sensor between the first substrate 510 and the second substrate 570, the second terminal portion 519B electrically connected to the touch sensor, and a second flexible printed circuit FPC2 electrically connected to the second terminal portion 519B (see FIG. 10A).

<<Display Portion>>

The display module 500 of one embodiment of the present invention further includes a pixel 502 to which a control signal and an image signal are supplied, a region 501 in which the pixels 502 are arranged, a driver circuit GD which supplies the control signal, a driver circuit SD which supplies the image signal, a wiring 511 electrically connected to the driver circuit SD, and the first terminal portion 519A electrically connected to the wiring 511 (see FIGS. 10A and 10B).

The pixel 502 includes a plurality of subpixels (e.g., subpixel 502R) and the like. Note that subpixels which have a function of displaying a variety of colors can be used. Specifically, a subpixel which has a function of displaying red can be used as the subpixel 502R. Moreover, subpixels which have a function of displaying green, blue, and the like can be used for the pixel 502.

The subpixel 502R includes the display element 550R, a coloring layer CF which has a region overlapping with the display element 550R, and a pixel circuit which has a function of supplying electric power to the display element 550R in response to the control signal and the image signal. For example, a transistor M0 or a capacitor can be used for the pixel circuit (see FIG. 10B).

In this embodiment, a light-emitting element (an organic EL element) is used as a display element. The display element 550R includes a first electrode 551R and a second electrode 552 to which electric power is supplied, and a layer 553 containing a light-emitting organic compound between the first electrode 551R and the second electrode 552.

The first electrode 551R is electrically connected to a source electrode or a drain electrode of the transistor M0.

The driver circuit SD includes a transistor MD or a capacitor CD. For example, a transistor which can be formed in the same process as the transistor M0 can be used as the transistor MD.

The display module 500 of one embodiment of the present invention includes the pixel circuit between the layer 553 containing a light-emitting organic compound and the first substrate 510 and an insulating layer 521 between the layer 553 containing a light-emitting organic compound and the pixel circuit.

The display module 500 of one embodiment of the present invention further includes a light-blocking layer BM having an opening in a region overlapping with the subpixel 502R.

Furthermore, the display module 500 of one embodiment of the present invention includes a functional film 570P which has a region overlapping with the region 501. For example, a polarizing plate can be used for the functional film 570P.

<<Sensing Portion>>

The display module 500 of one embodiment of the present invention further includes a touch sensor including a sensing element.

A control line CL(i) electrically connected to the touch sensor, a signal line ML(j) electrically connected to the touch sensor, a terminal electrically connected to the control line CL(i), and a second terminal portion 519B electrically connected to the signal line ML(j) are included (see FIG. 11A and FIG. 12).

The touch sensor includes a first electrode C1(i) and a second electrode C2(j) which does not partly overlap with the first electrode C1(i).

The first electrode C1(i) or the second electrode C2(j) includes a conductive film including regions having light-transmitting properties in regions overlapping with the pixels 502 or the subpixels 502R.

Alternatively, the first electrode C1(i) or the second electrode C2(j) includes a net-like conductive film having openings 576 in regions overlapping with the pixels 502 or the subpixels 502R.

The first electrode C1(i) is electrically connected to the control line CL(i) extended in a row direction (a direction indicated by an arrow R in FIG. 12). Note that the control line CL(i) has a function of supplying a control signal.

The second electrode C2(j) is electrically connected to the signal line ML(j) extended in a column direction (a direction indicated by an arrow C in FIG. 12). Note that the signal line ML(j) has a function of supplying a sensor signal (see FIG. 12).

The control line CL(i) includes a wiring BR(i,j). In the wiring BR(i,j), the control line CL(i) intersects with the signal line ML(j). An insulating layer 571 is provided between the wiring BR(i,j) and the signal line ML(j) (see FIG. 11B). Thus, a short circuit between the wiring BR(i,j) and the signal line ML(j) can be prevented.

Note that the display module 500 including the touch sensor can be referred to as an input/output module or a touch panel module.

The display module 500 can sense a nearby object and supply positional data of the nearby object or sensing data including the track or the like. For example, a user of the display module 500 can make a variety of gestures (e.g., tap, drag, swipe, and pinch in) to be sensed using his/her finger or the like that approaches or is in contact with the display module 500 as a pointer.

In addition, the user of the display module 500 can give a variety of operation instructions to an arithmetic device with the display module 500. For example, the display module 500 can sense a gesture, an arithmetic device can determine whether or not the sensing data supplied from the display module 500 satisfies a predetermined condition on the basis of a program or the like, and a predetermined instruction can be executed in the case where the condition is satisfied.

Individual components included in the display module 500 will be described below. Note that these components cannot be clearly distinguished from each Other and one component also serves as another component or includes part of another component in some cases.

For example, the display module 500 serves as a sensing panel or a display panel as well as a touch panel.

<<First Substrate>>

A variety of substrates can be used as the first substrate 510.

For example, a material similar to the material which can be used for the first substrate 101 described in Embodiment 1 can be used.

In this specification and the like, a transistor can be formed using any of a variety of substrates or any of a variety of bases, for example. The type of the substrate is not limited to a certain type. Examples of the substrate include a semiconductor substrate (e.g., a single crystal substrate or a silicon substrate), an SOI substrate, a glass substrate, a quartz substrate, a plastic substrate, a sapphire glass substrate, a metal substrate, a stainless steel substrate, a substrate including stainless steel foil, a tungsten substrate, a substrate including tungsten foil, a flexible substrate, an attachment film, paper including a fibrous material, a base film, and the like. As an example of a glass substrate, a barium borosilicate glass substrate, an aluminoborosilicate glass substrate, a soda lime glass substrate, and the like can be given. Examples of the flexible substrate, the attachment film, the base film, and the like are substrates of plastics typified by polyethylene terephthalate (PET), polyethylene naphthalate (PEN), polyether sulfone (PES), and polytetrafluoroethylene (PTFE). Another example is a synthetic resin such as acrylic. Furthermore, polypropylene, polyester, polyvinyl fluoride, and polyvinyl chloride can be given as examples. Other examples are polyamide, polyimide, aramid, epoxy, an inorganic vapor deposition film, paper, and the like. Specifically, the use of semiconductor substrates, single crystal substrates, SOI substrates, or the like enables the manufacture of small-sized transistors with a small variation in characteristics, size, shape, or the like and with high current capability. A circuit using such transistors achieves lower power consumption of the circuit or higher integration of the circuit.

A peeling layer is provided between the substrate and the transistor, and part or all of a semiconductor device is provided thereover. Then, the transistor can be separated from the substrate and transferred onto another substrate. In such a case, the transistor can also be transferred even onto a substrate having low heat resistance or a flexible substrate. For the above peeling layer, a stack including inorganic films, which are a tungsten film and a silicon oxide film, or a structure in which an organic resin film of polyimide or the like is formed over a substrate can be used, for example.

In other words, after the transistor is formed using a substrate, the transistor may be transferred to another substrate so as to be positioned over another substrate. Examples of a substrate to which a transistor is transferred include, in addition to the above substrate over which the transistor can be formed, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), and the like), a leather substrate, a rubber substrate, and the like. When such a substrate is used, a transistor with excellent characteristics or a transistor with low power consumption can be formed, a device with high durability can be formed, high heat resistance can be provided, or reduction in weight or thickness can be achieved.

<<Second Substrate>>

A variety of substrates can be used as the second substrate 570.

For example, a material similar to the material which can be used for the second substrate 102 described in Embodiment 1 can be used.

<<First Adhesive Layer, Second Adhesive Layer>>

A variety of materials can be used as the first adhesive layer 506 or the second adhesive layer 507.

For example, a material similar to the material which can be used for the first adhesive layer 106 described in Embodiment 1 can be used.

<<First Layer, Second Layer>>

The first layer 503 includes the insulating layer, the transistor M0, the transistor MD, the capacitor CD, the display element 550R, the third partition 528, the spacer KB, and the like.

The spacer KB can be regarded as a projecting portion of the first layer 503, here.

The second layer 504 includes the insulating layer, the coloring layer CF, the light-blocking layer BM, the sensing element, and the like.

A surface of the first layer 503 which faces the first substrate 510 is referred to as a first surface and a surface of the second layer 504 which faces the second substrate 570 is referred to as a second surface.

A distance 533, which is between the first surface and the second surface in a region 531 including the spacer KB, is longer than a distance 534, which is between the first surface and the second surface in a region 532 around the region 531.

The first layer 503 and the second layer 504 are partly in contact with each other in the region 531 including the spacer KB. The first layer 503 and the second layer 504 are preferably in contact with each other in the region including the light-emitting element and the coloring layer CF.

According to the present invention, the gap between the light-emitting element and the coloring layer CF is eliminated or partly narrowed as compared to that in the conventional structure such as a structure in which an adhesive is filled between the light-emitting element and the coloring layer CF. No gap or a partly narrowed gap as compared to that in the conventional structure improves the viewing angle of the display module 500, reduces the light leakage from the adjacent pixel, and increases the reliability.

<<Transistor>>

In this specification and the like, for example, transistors with a variety of structures can be used as a transistor, without limitation to a certain type. For example, a transistor including a single crystal silicon or a non-single-crystal semiconductor film typified by amorphous silicon, polycrystalline silicon, microcrystalline (also referred to as microcrystal, nanocrystal, or semi-amorphous) silicon, or the like can be used as a transistor. Alternatively, a thin film transistor (TFT) formed using the above semiconductor as thin films can be used. In the case of using the TFT, there are a variety of advantages. For example, since the TFT can be formed at temperature lower than that of the case of using single crystal silicon, manufacturing cost can be reduced or a manufacturing apparatus can be made larger. Since the manufacturing apparatus can be made larger, the TFT can be formed using a large substrate. Therefore, many display devices can be formed at the same time at low cost. In addition, a substrate having low heat resistance can be used because of low manufacturing temperature. Therefore, the transistor can be formed using a light-transmitting substrate. Alternatively, transmission of light in a display element can be controlled by using the transistor formed using the light-transmitting substrate. Alternatively, part of a film included in the transistor can transmit light because of a small thickness of the transistor. Therefore, the aperture ratio can be improved.

Note that when a catalyst (e.g., nickel) is used in the case of forming polycrystalline silicon, crystallinity can be further improved and a transistor having excellent electric characteristics can be formed. Accordingly, a gate driver circuit (e.g., a scan line driver circuit), a source driver circuit (e.g., a signal line driver circuit), and a signal processing circuit (e.g., a signal generation circuit, a gamma correction circuit, or a DA converter circuit) can be formed using the same substrate.

Note that when a catalyst (e.g., nickel) is used in the case of forming microcrystalline silicon, crystallinity can be further improved and a transistor having excellent electric characteristics can be formed. In that case, crystallinity can be improved by just performing heat treatment without performing laser irradiation. Accordingly, a gate driver circuit and part of a source driver circuit (e.g., an analog switch) can be formed using the same substrate. Note that when laser irradiation for crystallization is not performed, unevenness in crystallinity of silicon can be suppressed. Therefore, high-quality images can be displayed. Note that it is possible to form polycrystalline silicon or microcrystalline silicon without a catalyst (e.g., nickel).

Note that although the crystallinity of silicon is preferably improved to polycrystal, microcrystal, or the like in the whole panel, the present invention is not limited to this. The crystallinity of silicon may be improved only in part of the panel. Selective increase in crystallinity can be achieved by selective laser irradiation or the like. For example, only a peripheral circuit region excluding pixels may be irradiated with laser light. Alternatively, only a region of a gate driver circuit, a source driver circuit, or the like may be irradiated with laser light. Alternatively, only part of a source driver circuit (e.g., an analog switch) may be irradiated with laser light. Accordingly, the crystallinity of silicon can be improved only in a region in which a circuit needs to be operated at high speed. Because a pixel region is not particularly needed to be operated at high speed, even if crystallinity is not improved, the pixel circuit can be operated without any problem. Thus, a region whose crystallinity is improved is small, so that manufacturing steps can be shortened. This can increase throughput and reduce manufacturing cost. Alternatively, since the number of necessary manufacturing apparatus is small, manufacturing cost can be reduced.

Examples of the transistor include a transistor including a compound semiconductor (e.g., SiGe or GaAs) or an oxide semiconductor (e.g., Zn—O, In—Ga—Zn—O, In—Zn—O, In—Sn—O (ITO), Sn—O, Ti—O, Al—Zn—Sn—O (AZTO), or In—Sn—Zn—O) and a thin film transistor including a thin film of such a compound semiconductor or an oxide semiconductor. Because manufacturing temperature can be lowered, such a transistor can be formed at room temperature, for example. The transistor can thus be formed directly on a substrate having low heat resistance, such as a plastic substrate or a film substrate. Note that such a compound semiconductor or an oxide semiconductor can be used not only for a channel portion of the transistor but also for other applications. For example, such a compound semiconductor or an oxide semiconductor can be used for a wiring, a resistor, a pixel electrode, a light-transmitting electrode, or the like. Such an element can be formed at the same time as the transistor; thus, cost can be reduced.

Note that a transistor formed by an ink-jet method or a printing method can be used as the transistor, for example. Accordingly, such a transistor can be formed at room temperature or at a low vacuum, or can be formed using a large substrate. Thus, the transistor can be formed without using a mask (reticle), which enables the layout of the transistor to be easily changed. Alternatively, the transistor can be formed without using a resist, leading to reductions in material cost and the number of steps. Further, since a film can be formed only in a portion where the film is needed, a material is not wasted as compared with the case of employing a manufacturing method by which etching is performed after the film is formed over the entire surface, so that the cost can be reduced.

Note that a transistor including an organic semiconductor or a carbon nanotube can be used as the transistor, for example. Thus, such a transistor can be formed over a flexible substrate. A device including a transistor which includes an organic semiconductor or a carbon nanotube can be shock-resistant.

Note that transistors with a variety of different structures can be used as the transistor. For example, a MOS transistor, a junction transistor, a bipolar transistor, or the like can be used as the transistor. By using a MOS transistor as the transistor, the size of the transistor can be reduced. Thus, a number of transistors can be mounted. By using a bipolar transistor as the transistor, a large amount of current can flow. Thus, a circuit can be operated at high speed. Note that a MOS transistor and a bipolar transistor may be formed over one substrate, in which case reductions in power consumption and size, high-speed operation, and the like can be achieved.

<<Wiring, Terminal>>

The wiring or the terminal has a function of supplying an image signal, a control signal, a sensor signal, a power supply potential, or the like. The wiring includes the control line CL(i), the signal line ML(j), and the like.

A variety of conductive materials can be used for the wiring or the terminal.

For example, an inorganic conductive material, an organic conductive material, a metal material, a conductive ceramic material, or the like can be used for the wiring or the terminal.

Specifically, a metal element selected from aluminum, gold, platinum, silver, copper, chromium, tantalum, titanium, molybdenum, tungsten, nickel, iron, cobalt, palladium, and manganese, or the like can be used for the wiring or the terminal. Alternatively, an alloy including any of the above-described metal elements, or the like can be used for the wiring or the terminal. Further alternatively, an alloy including any of the above-described metal elements in combination, or the like can be used for the wiring or the terminal. In particular, an alloy of copper and manganese is suitably used in microfabrication with the use of a wet etching method.

Specifically, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, or the like can be used.

Specifically, a conductive oxide such as indium oxide, ITO, indium zinc oxide, zinc oxide, or zinc oxide to which gallium is added can be used for the wiring or the terminal.

Specifically, a film including graphene or graphite can be used for the wiring or the terminal.

For example, a film including graphene oxide is formed and is reduced, so that a film including graphene can be formed. As a reducing method, a method using heat, a method using a reducing agent, or the like can be employed.

Specifically, a conductive high molecule can be used for the wiring or the terminal.

<<Display Unit>>

A display unit 580R includes the display element 550R or the coloring layer CF which transmits at least part of light.

A spacer KB is provided between the third partition 528 and the light-blocking layer BM. The spacer KB has a function of controlling a distance between the display element 550R and the coloring layer CF.

For example, a layer containing a material such as a pigment or a dye, a color filter, or the like can be used as the coloring layer CF. Thus, it is possible to provide a display unit which displays a specific color of light transmitted through the coloring layer CF.

A microcavity structure which includes a reflective film and a semi-transmissive and semi-reflective film can be used for the display unit 580R.

Specifically, a light-emitting element including a reflective conductive film as one electrode, a semi-transmissive and semi-reflective conductive film as the other electrode, and a layer containing a light-emitting organic compound between the two electrodes can be used for the display unit 580R.

For example, a microresonator for extracting red light efficiently and a coloring layer which transmits red light may be used in the display unit 580R for displaying red, a microresonator for extracting green light efficiently and a coloring layer which transmits green light may be used in a display unit for displaying green, a microresonator for extracting blue light efficiently and a coloring layer which transmits blue light may be used in a display unit for displaying blue light, or a microresonator for extracting yellow light efficiently and a coloring layer which transmits yellow light may be used in a display unit for displaying yellow light.

<<Display Element>>

Display media whose contrast, luminance, reflectance, transmittance, or the like is changed by an electrical or/and magnetic effect can be used as a display element 550R.

For example, an organic EL element which emits white light can be used.

For example, a plurality of organic EL elements which emit light of different colors can be used.

For example, the third partition 528 for division into a plurality of display elements can be used. For example, an insulating material can be used for the third partition 528. Specifically, an insulating inorganic oxide material, a resin, or the like can be used.

As the display element, an electroluminescence (EL) element (e.g., an EL element including organic and inorganic materials, an organic EL element, or an inorganic EL element), an LED (e.g., a white LED, a red LED, a green LED, or a blue LED), a transistor (a transistor which emits light depending on current), an electron emitter, a liquid crystal element, electronic ink, an electrophoretic element, a grating light valve (GLV), a plasma display panel (PDP), a display element using micro electro mechanical systems (MEMS), a digital micromirror device (DMD), a digital micro shutter (DMS), MIRASOL (registered trademark), an interferometric modulator (IMOD) element, a MEMS shutter display element, an optical-interference-type MEMS display element, an electrowetting element, a piezoelectric ceramic display, or the like can be used, for example.

<<First Electrode>>

A conductive material can be used for the first electrode 551R. In particular, a material which efficiently reflects light emitted from the layer 553 containing a light-emitting organic compound is preferable.

For example, an inorganic conductive material, an organic conductive material, a metal material, a conductive ceramic material, or the like can be used. Note that a structure of a single layer or stacked layers including a material selected from the above materials can be used, for example.

Specifically, a metal element selected from aluminum, gold, platinum, silver, chromium, tantalum, titanium, molybdenum, tungsten, nickel, iron, cobalt, palladium, and manganese; an alloy including any of the above-described metal elements; an alloy including any of the above-described metal elements in combination; or the like can be used.

In particular, silver, aluminum, and an alloy including any of them are preferable because of their high reflectance with respect to visible light.

Alternatively, a conductive oxide such as indium oxide, ITO, indium zinc oxide, zinc oxide, or zinc oxide to which gallium is added can be used.

Alternatively, graphene or graphite can be used. The film including graphene can be formed by reducing a film including film-shaped graphene oxide, for example. As a reducing method, a method using heat, a method using a reducing agent, or the like can be employed.

Alternatively, a conductive high molecule can be used.

<<Second Electrode>>

A light-transmitting conductive material can be used for the second electrode 552.

For example, a material which can be used for the first electrode 551R is made thin enough to have a light-transmitting property to be used for the second electrode 552. Specifically, a metal thin film with a thickness greater than or equal to 5 nm and less than or equal to 30 nm can be used.

Note that a single layer or stacked layers can include the material. Specifically, a stack of silver with a thickness greater than or equal to 5 nm and less than or equal to 30 nm and a metal oxide layer including indium and tin can be used.

<<Layer Containing Light-Emitting Organic Compound>>

A layer containing an organic compound which emits fluorescence or light obtained through a triplet excited state can be used as the layer 553 containing a light-emitting organic compound.

A structure of a single layer or stacked layers can be used for the layer 553 containing a light-emitting organic compound.

For example, a layer including a material with a higher hole-transport property than an electron-transport property, a layer including a material with a higher electron-transport property than a hole-transport property, or the like can be used.

For example, a plurality of layers 553 containing light-emitting organic compounds with different compositions can be used in one display panel. For example, the display panel can include a layer containing a red light-emitting organic compound, a layer containing a green light-emitting organic compound, and a layer containing a blue light-emitting organic compound.

A light-emitting element includes a light-emitting substance between a pair of electrodes. Examples of the light-emitting substance include a material which can convert the singlet excitation energy into light emission (e.g., a fluorescent material) and a material which can convert the triplet excitation energy into light emission (e.g., a phosphorescent material or a thermally activated delayed fluorescence (TADF) material).

The above-described light-emitting substance has a peak of an emission spectrum in at least any one of blue (greater than or equal to 420 nm and less than 500 nm), green (greater than or equal to 500 nm and less than 550 nm), yellow (greater than or equal to 550 nm and less than 600 nm), and red (greater than or equal to 600 nm and less than or equal to 740 nm) wavelength ranges. Note that the above-described light-emitting substance can be formed by an evaporation method (including a vacuum evaporation method), an ink-jet method, a coating method, gravure printing, or the like.

Examples of a substance which has a peak of an emission spectrum in a blue wavelength range include fluorescent materials containing a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, a naphthalene derivative, and the like. A pyrene derivative is particularly preferable because it has a high emission quantum yield.

As the substance which has a peak of an emission spectrum in a blue wavelength range, an iridium-, rhodium-, or platinum-based organometallic complex or a metal complex can be used for example; in particular, an organoiridium complex such as an iridium-based ortho-metalated complex is preferable. As an ortho-metalated ligand, a 4H-triazole ligand, a 1H-triazole ligand, an imidazole ligand, a pyridine ligand, and the like can be given. Examples of the substance which has a peak of an emission spectrum in a blue wavelength range includes an organometallic iridium complex which includes an iridium metal, a ligand coordinated to the iridium metal, and a substituent bonded to the ligand, and in which the substituent is a bridged cyclic hydrocarbon group (e.g., an adamantyl group or a norbornyl group) whose mass number is greater than or equal to 90 and less than 200. Moreover, the above-described ligand is preferably a nitrogen-containing five-membered heterocyclic skeleton (e.g., an imidazole skeleton or a triazole skeleton). When a substance including the above-described nitrogen-containing five-membered heterocyclic skeleton is used for a light-emitting layer, a light-emitting element having high emission efficiency or high reliability can be obtained.

As the substances which have peaks of emission spectra in green, yellow, and red wavelength ranges, an iridium-, rhodium-, or platinum-based organometallic complex or a metal complex can be used; in particular, an organoiridium complex such as an iridium-based ortho-metalated complex is preferable. As an ortho-metalated ligand, a 4H-triazole ligand, a 1H-triazole ligand, an imidazole ligand, a pyridine ligand, a pyrimidine ligand, a pyrazine ligand, an isoquinoline ligand, and the like can be given. As the metal complex, a platinum complex having a porphyrin ligand, and the like can be given. Furthermore, the organometallic iridium complex having a pyrazine ligand is preferable because red light emission with favorable chromaticity can be provided. Moreover, the organometallic iridium complex having a pyrimidine ligand has high reliability or emission efficiency and is thus preferable.

The light-emitting element may include a substance with a carrier (electron or hole)-transport property in addition to the above-described light-emitting substance. Besides the above-described light-emitting substance, an inorganic compound or a high molecular compound (e.g., an oligomer, a dendrimer, or a polymer) may be included in the light-emitting element.

<<Flexible Printed Circuit>>

Flexible printed circuits of a variety of structures can be used for the first flexible printed circuit FPC1 or the second flexible printed circuit FPC2.

The flexible printed circuit includes a wiring electrically connected to the terminal, a base which supports the wiring, and a coating layer which has a region overlapping with the wiring. The wiring includes a region between the base and the coating layer and a region not overlapping with the coating layer.

Note that the region of the wiring which does not overlap with the coating layer is used for a terminal of the flexible printed circuit.

<<Sensing Element, Sensing Circuit>>

A sensing element for sensing capacitance, illuminance, magnetic force, a radio wave, pressure, or the like and supplying a signal based on the sensed physical quantity can be used for the functional layer.

For example, a conductive film, a photoelectric conversion element, a magnetic sensing element, a piezoelectric element, a resonator, or the like can be used as the sensing element.

For example, a sensing circuit having a function of supplying a signal which varies on the basis of the parasitic capacitance of a conductive film can be used for the functional layer. Thus, a finger or the like which approaches the conductive film in the air can be sensed with change in capacitance.

Specifically, a control signal is supplied to the first electrode $C1(i)$ with the control line $CL(i)$. The potential of the second electrode $C2(j)$ which changes on the basis of the supplied control signal and the capacitance is obtained with the signal line $ML(j)$ and can be supplied as a sensor signal.

For example, a circuit including a capacitor one electrode of which is connected to a conductive film can be used as a sensing circuit.

The sensing element may be formed by depositing a film for forming the sensing element over the second substrate 570 and processing the film.

Alternatively, the display module 500 may be formed in such a manner that part of the display module 500 is formed over another base, and the part is transferred to the second substrate 570.

<<Functional Film>>

A variety of functional films can be used for the functional film 570P.

For example, an anti-reflective film or the like can be used as the functional film 570P. Specifically, an anti-glare coat, a circularly polarizing plate, or the like can be used. Thus, the intensity of outside light reflected when the display module 500 is used outdoors can be reduced, for example. Moreover, glare of lighting can be suppressed when used indoors, for example.

For example, a ceramic coat layer or a hard coat layer can be used as the functional film 570P. Specifically, a ceramic coat layer containing aluminum oxide, silicon oxide, or the like, a UV cured resin layer, or the like can be used.

This embodiment can be combined with any of the other embodiments in this specification as appropriate.

Embodiment 4

In this embodiment, a structure of a data processor of one embodiment of the present invention will be described with reference to FIGS. 13A-1, 13A-2, 13A-3, 13B-1, 13B-2, 13C-1, and 13C-2.

FIGS. 13A-1, 13A-2, 13A-3, 13B-1, 13B-2, 13C-1, and 13C-2 are views of a data processor of one embodiment of the present invention.

Figures 1, 13A:
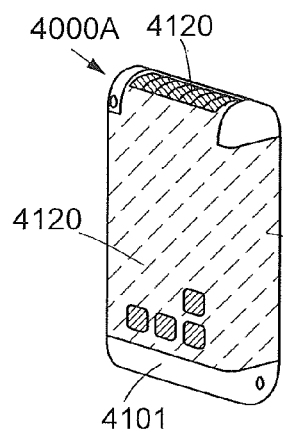
FIGS. 13A-1, 13A-2, 13A-3, 13B-1, 13B-2, 13C-1, and 13C-2 illustrate structures of data processing devices of an embodiment.
Figures 2, 13A:
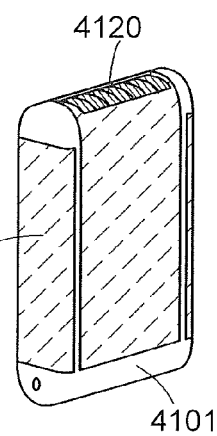
Figures 3, 13A:
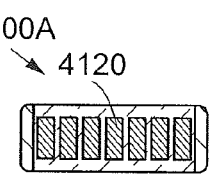

FIGS. 13A-1 to 13A-3 are each a projection view of a data processor 4000A of one embodiment of the present invention.

Figures 1, 13B:
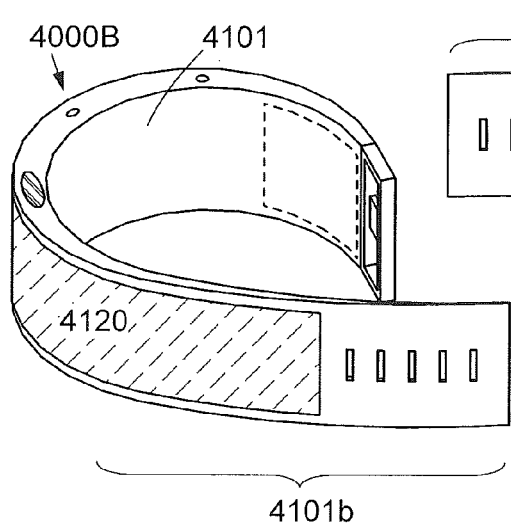
Figures 2, 13B:
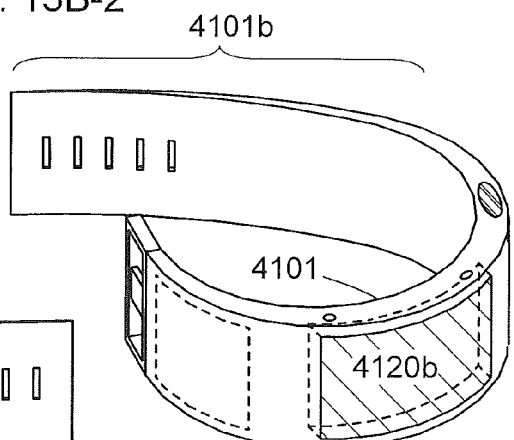

FIGS. 13B-1 and 13B-2 are each a projection view of a data processor 4000B of one embodiment of the present invention.

Figures 1, 13C:
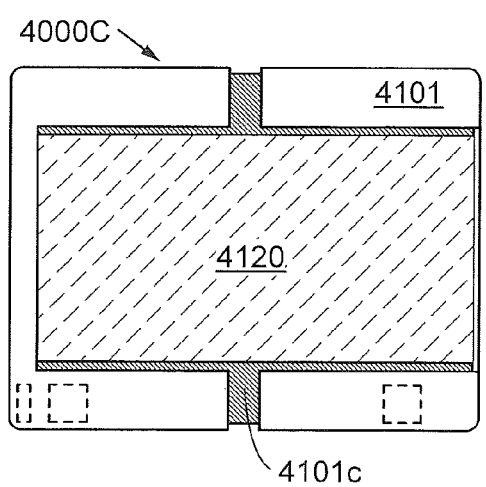
Figures 2, 13C:
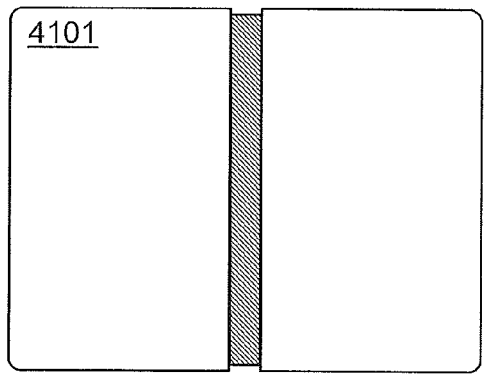

FIGS. 13C-1 and 13C-2 are a top view and a bottom view of a data processor 4000C of one embodiment of the present invention.

<<Data Processor A>>

The data processor 4000A includes an input/output portion 4120 and a housing 4101 which supports the input/output portion 4120 (see FIGS. 13A-1 to 13A-3).

The input/output portion 4120 includes a functional panel of one embodiment of the present invention. For example, the functional panel described in Embodiment 3 can be used for the input/output portion 4120.

The data processor 4000A further includes an arithmetic unit, a memory unit which stores a program to be executed by the arithmetic unit, and a power source such as a battery which supplies electric power for driving the arithmetic unit.

Note that the housing 4101 houses the arithmetic unit, the memory unit, the battery, and the like.

The data processor 4000A can display information on its side surface and/or top surface.

A user of the data processor 4000A can give operation instructions by using a finger in contact with the side surface and/or top surface.

<<Data Processor B>>

The data processor 4000B includes a housing 4101 (see FIGS. 13B-1 and 13B-2). The housing 4101 includes a belt-like portion 4101b which can be fastened with a buckle.

The housing 4101 supports an input/output portion 4120 and an input/output portion 4120b.

The input/output portion 4120 or the input/output portion 4120b includes a functional panel of one embodiment of the present invention. For example, the functional panel described in Embodiment 3 can be used for the input/output portion 4120.

The data processor 4000B further includes an arithmetic unit, a memory unit which stores a program to be executed by the arithmetic unit, and a power source such as a battery which supplies electric power for driving the arithmetic unit.

The housing 4101 houses the arithmetic unit, the memory unit, the battery, and the like.

The data processor 4000B can display information on the input/output portion 4120 or the input/output portion 4120b.

A user of the data processor 4000B can give operation instructions by using a finger in contact with the input/output portion 4120 or the input/output portion 4120b.

<<Data Processor C>>

The data processor 4000C includes an input/output portion 4120 and a housing 4101 which supports the input/output portion 4120 (see FIGS. 13C-1 and 13C-2).

The input/output portion 4120 includes a functional panel of one embodiment of the present invention. For example, the functional panel described in Embodiment 3 can be used for the input/output portion 4120.

The data processor 4000C further includes an arithmetic unit, a memory unit which stores a program to be executed by the arithmetic unit, and a power source such as a battery which supplies electric power for driving the arithmetic unit.

Note that the housing 4101 houses the arithmetic unit, the memory unit, the battery, and the like.

The housing 4101 includes a region 4101c which can be bent. Accordingly, the data processor 4000C can be folded in two at the region 4101c.

Note that this embodiment can be combined with any of the other embodiments in this specification as appropriate.

This application is based on Japanese Patent Application serial No. 2014-266983 filed with Japan Patent Office on Dec. 29, 2014, the entire contents of which are hereby incorporated by reference.

What is claimed is:

1. A method for manufacturing a functional panel, comprising the steps of:
    preparing a first formation substrate provided with a first layer with a first peeling layer therebetween, and a second substrate including a region in contact with a second layer;
    bonding the first layer and the second layer to each other with a sealing portion in a reduced-pressure atmosphere;
    peeling the first peeling layer and the first layer in an atmosphere with a pressure higher than that of the reduced-pressure atmosphere; and
    bonding the first layer and a first substrate to each other with a first adhesive layer.

2. A method for manufacturing a functional panel, comprising the steps of:
    preparing a first formation substrate provided with a first layer with a first peeling layer therebetween, and a second substrate provided with a second layer with a third layer therebetween;
    bonding the first layer and the second layer to each other with a sealing portion in a reduced-pressure atmosphere;
    peeling the first peeling layer and the first layer in an atmosphere with a pressure higher than that of the reduced-pressure atmosphere; and
    bonding the first layer and a first substrate to each other with a first adhesive layer.

3. A method for manufacturing a functional panel, comprising the steps of:
    preparing a first formation substrate provided with a first layer with a first peeling layer therebetween, and a second formation substrate provided with a second layer with a second peeling layer therebetween;
    bonding the first layer and the second layer to each other with a sealing portion in a reduced-pressure atmosphere;
    peeling the first peeling layer and the first layer in an atmosphere with a pressure higher than that of the reduced-pressure atmosphere;
    bonding the first layer and a first substrate to each other with a first adhesive layer;
    peeling the second peeling layer and the second layer in an atmosphere with a pressure higher than that of the reduced-pressure atmosphere; and
    bonding the second layer and a second substrate to each other with a second adhesive layer.

4. The method for manufacturing the functional panel according to any one of claims 1 to 3,
    wherein the reduced-pressure atmosphere is lower than or equal to 10 Pa.

5. The method for manufacturing the functional panel according to any one of claims 1 to 3,
    wherein the pressure higher than that of the reduced-pressure atmosphere is atmospheric pressure.

* * * * *